United States Patent [19]
Behrens et al.

[11] Patent Number: 5,623,377
[45] Date of Patent: Apr. 22, 1997

[54] FILTERING A READ SIGNAL TO ATTENUATE SECONDARY PULSES CAUSED BY POLE TIPS OF A THIN FILM MAGNETIC READ HEAD

[75] Inventors: Richard T. Behrens, Louisville; Neal Glover, Broomfield; Trent O. Dudley, Littleton; Alan J. Armstrong, Broomfield; Christopher P. Zook, Longmont; William G. Bliss, Thornton, all of Colo.

[73] Assignee: Cirrus Logic, Inc., Fremont, Calif.

[21] Appl. No.: 222,666

[22] Filed: Apr. 4, 1994

Related U.S. Application Data

[63] Continuation-in-part of Ser. No. 43,662, Apr. 6, 1993, abandoned.

[51] Int. Cl.$^6$ .............................. G11B 5/035; G11B 5/09
[52] U.S. Cl. .................................. 360/65; 360/45
[58] Field of Search ................................ 360/46, 65, 45; 375/11, 12, 14, 99, 101

[56] References Cited

U.S. PATENT DOCUMENTS

| | | | |
|---|---|---|---|
| 4,789,994 | 12/1988 | Randall et al. | 375/12 |
| 4,947,408 | 8/1990 | Sadr et al. | 375/94 |
| 5,003,555 | 3/1991 | Bergmans | 375/12 |
| 5,027,369 | 6/1991 | Kuenast | 375/14 |
| 5,265,125 | 11/1993 | Ohta | 360/65 |
| 5,307,213 | 4/1994 | Nishiyama | 360/46 |
| 5,341,249 | 8/1994 | Abbott et al. | 360/46 |

*Primary Examiner*—W. C. Kim
*Attorney, Agent, or Firm*—Howard Sheerin

[57] ABSTRACT

A filter for compensating discrete secondary pulse formations associated with a data stream of discrete main pulses produced from data read from magnetic media. The filter's impulse response comprises a center coefficient with side compensating coefficients for attenuating the secondary pulses when the input signal is convolved with the impulse response. The magnitude and delay of the compensation coefficients are programmable and are adaptively adjusted to optimize the impulse response for a given environment. In a traditional FIR embodiment, two delay lines are used to generate the two programmable delays between the center coefficient and side compensation coefficients. In the preferred embodiment, an IIR filter provides the two programmable delays using only one delay line thereby reducing the size and cost of the circuit. Also in the preferred embodiment, the data stream is interleaved into an even and odd data stream and processed in parallel by two filters in order to double the throughput. Further, the pre-cursor correcting portion of the filter can be disabled in order to avoid delaying the data stream while still canceling the post-cursor secondary pulses. The filter also comprises attenuation and adder means to match the coincident sample values in amplitude and add them to substantially eliminate the effect of the secondary pulses in the discrete data stream.

38 Claims, 20 Drawing Sheets

5,623,377

FILTERING A READ SIGNAL TO ATTENUATE SECONDARY PULSES CAUSED BY POLE TIPS OF A THIN FILM MAGNETIC READ HEAD

This application is a continuation-in-part of U.S. Ser. No. 08/043,662 filed Apr. 6, 1993 now abandoned. This invention relates to computer technology and more especially to instrumentalities for storing and retrieving digitized data on magnetic storage media.

CROSS-REFERENCE TO RELATED APPLICATIONS

This application is related to several other U.S. Patents, namely: U.S. Pat. Nos. 5,291,499; 5,329,554; 5,359,631; 5,424,881; and 5,297,184 which relate to "Sequence Detector", "Digital Pulse Detector", "Timing Recovery Circuit for Synchronous Waveform Sampling", "Synchronous Read Channel" and "Gain Control Circuit for Synchronous Waveform Sampling". All of the above-named U.S. Patents are incorporated herein by reference.

BACKGROUND OF THE INVENTION

In digital computing systems the media of choice for storing data is quite often magnetic. Magnetic tape systems are frequently used to archive data and magnetic disk systems are used for the interactive processing of data with the central processing unit and semi-conductor memory elements.

Drive electronics units for magnetic storage devices provide an interface to the host computer system for receiving data to be written to the magnetic media and for presenting data to the host that has been read from the magnetic storage media. In magnetic storage devices a transducing head must be situated in close proximity to the magnetic media in order to write data to the media and read data from the media. Significant effort has been made to pack data ever more densely on the media while at the same time improving the write and read control functions to approach error-free operation. In the effort to produce dense recording and error-free retrieval various heads have been developed including the ferrite head, the thin film head, the metal-in-gap (MIG) head, and most recently the magneto-resistive (MR) head. Regardless of the head technology the write operation involves reversing the magnetic orientation of the media from north to south or from south to north through changes in electrical current levels from positive to negative or negative to positive. When such transitions occur at a data bit location the transition may represent a one bit while no transition at the data bit location represents a zero bit.

Limiting factors in packing data onto the magnetic media are generally associated with the read-back operation where the magnetic transition results in an electrical pulse in the head which is transferred from the head to the drive electronics unit for amplification and detection. The pulse signals at the head are extremely small and therefore subject to obfuscation. Also, increased data density narrows the window in which a transition is read and successive transitions can create shifts in the position of a sensed read pulse large enough to move the pulse out of the window and into another bit location.

Some types of head technology produce unwanted secondary pulses when reading transitions. For example, the thin film head produces perturbations in sensing transitions due to the pole tip effect, such that the desired pulse formation is clouded by leading and trailing undershoot pulses. When packing data more densely on media, the undershoot pulses tend to interfere with the accurate retrieval of other data pulses in the chain of data pulses read from the media. MIG heads may also produce somewhat similar secondary pulses but the polarity of the secondary pulse is the same as the main pulse. It is, therefore, the general object of this invention to smooth out the response obtained from such a head so that the data pulse ultimately produced by the drive electronics unit approaches a more idealized configuration.

SUMMARY OF THE INVENTION

Briefly stated, this invention relates to discrete time, preferably digital, sampling techniques to describe the magnitude of a data pulse produced from a magnetic transition on magnetic storage media. The values of the samples describing the pulse are altered, an appropriate delay is provided, and utilized to smooth out the pulse perturbations present in the retrieved wave form, for example, the undershoot pulses produced by a thin film head.

Smoothing the spectrum by canceling the undesired secondary pulses is achieved by filtering the discrete-time input signal with a filter having a particular impulse response. If the main pulse from the input signal is at t=0, then the impulse response of the smoothing filter is an impulse at t=0 and having a predetermined number of compensation coefficients (hereinafter compensation taps) at a time equal to the period between the main and secondary pulses of the input signal. The output of the filter is the convolution of the filter's impulse response with the samples of the discrete-time input signal. The compensation taps of the filter are scaled such that when convolved with the sample values of the secondary pulses the output is insignificant. The compensation taps are also scaled such that when convolved with the samples from the main pulse the result is opposite in sign and equal in magnitude to the samples from the secondary pulses, thereby canceling the secondary pulses.

The filter of the present invention is programmable in that the delay between the center tap and compensation taps as well as the magnitude of the compensation taps can be adjusted to operate with the various magnetic read head technologies as well with different drive systems. Consequently, the filter can be incorporated into a read channel IC that can be programmed to function in many different environments rather than having a specific read channel IC for each system.

Further, the filter is a linear system that processes a waveform of many superimposed pulses just as an isolated pulse is processed; as a consequence, all secondary pulses in the waveform are compensated.

DETAILED DESCRIPTION

Figure 1A:
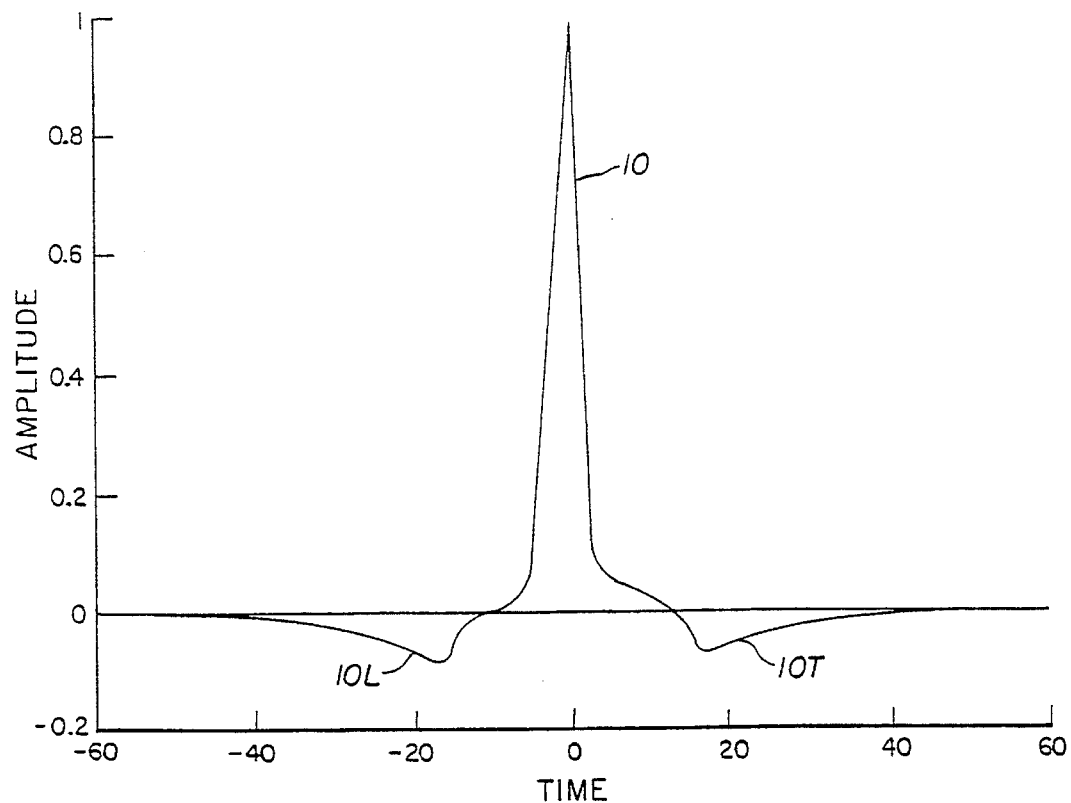
FIG. 1A shows a noise free isolated pulse produced from a typical thin film head.

For an understanding of the features of the invention reference is made to the drawing. In the various figures of the drawing, like reference numerals have been used to identify similar elements.

As mentioned above digital information is frequently stored by recording patterns of magnetization on a surface such as a magnetic disk or magnetic tape. A recorded magnetization pattern induces a time varying response signal in a sensor or read head as the magnetic pattern moves past the read head. The resulting signal is processed electronically to reconstruct the bits of the digital information stored on the disk or tape.

Inductive read heads are a class of sensors commonly used to read magnetically stored information. The heads are positioned closely to the magnetic surface and as the magnetic surface is moved under the head the head responds to the derivative of the magnetic flux from the magnetized medium so that a voltage pulse is produced each time the head encounters a transition in the direction of magnetization of the medium.

Ideally, the pulses induced in the read head would be impulse functions of infinite amplitude, zero width and some finite energy. In reality, there are bandwidth limiting factors in the write process in the recording medium and in the read process which produce a pulse of finite amplitude and width. The shape of the pulse is determined by many factors, including the geometry of the head, distance between head and medium, magnetic properties of the medium and the head, etc.

Successive magnetic transitions along a track will necessarily alternate in polarity. A transition from north to south magnetization must be followed by a transition from south to north. The polarity of the voltage pulses induced in the read head alternate with the polarity of the transitions.

FIG. 1A shows an isolated pulse 10 produced from a typical thin-film head with a leading undershoot pulse 10L and a trailing undershoot pulse 10T. Note that the undershoot pulses are somewhat less than 10% in magnitude relative to the main pulse 10 but are considerably wider than the main pulse 10. Pole-tip effects produced by the thin film head create the undershoot pulses 10L and 10T both leading and trailing the isolated pulse 10.

Figure 1B:
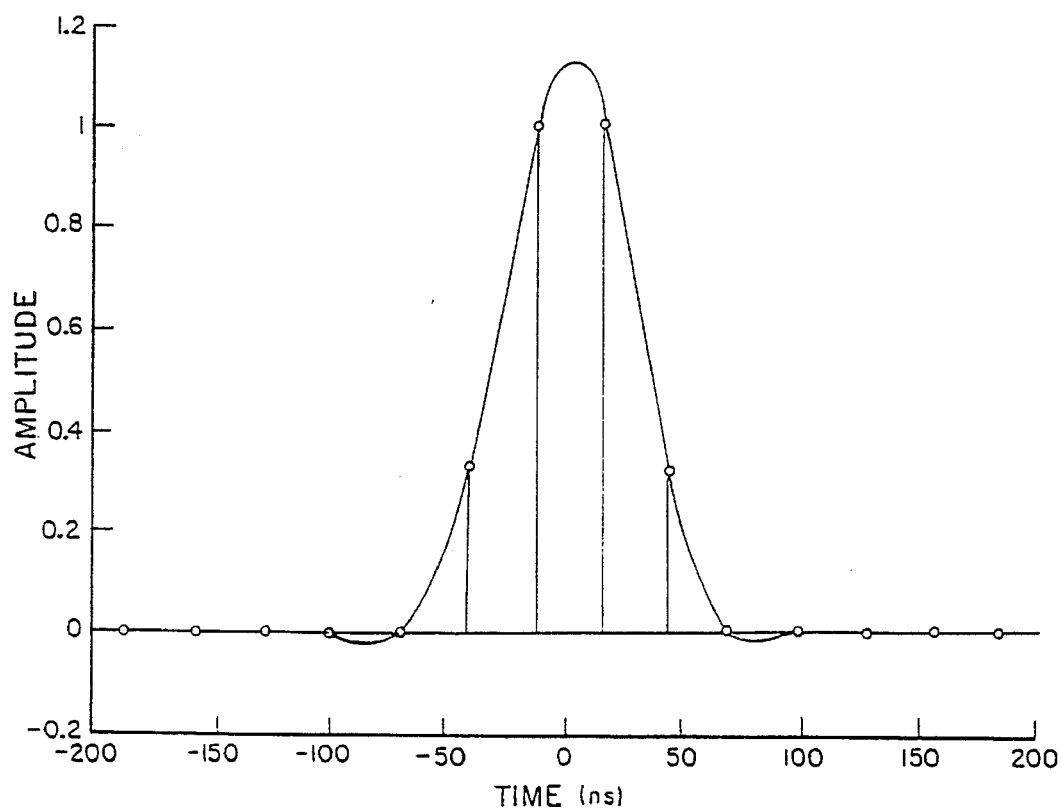
FIG. 1B is a representation of a desired read pulse showing the location of four discrete samples describing the pulse.

FIG. 1A should be compared with FIG. 1B which shows the pulse configuration desired, without undershoots either leading or lagging the isolated pulse and with the isolated pulse narrowed such that only a discrete number of non zero samples are included within the pulse width. FIG. 1B illustrates a pulse with four non zero sample values. These sample values become the digitized representation of the isolated pulse 10 in a discrete time or digital system. In setting up the system, the maximum digital value is arbitrarily scaled to be represented by a "one" with the smaller digital samples taking a ratio thereto.

Figure 1C:
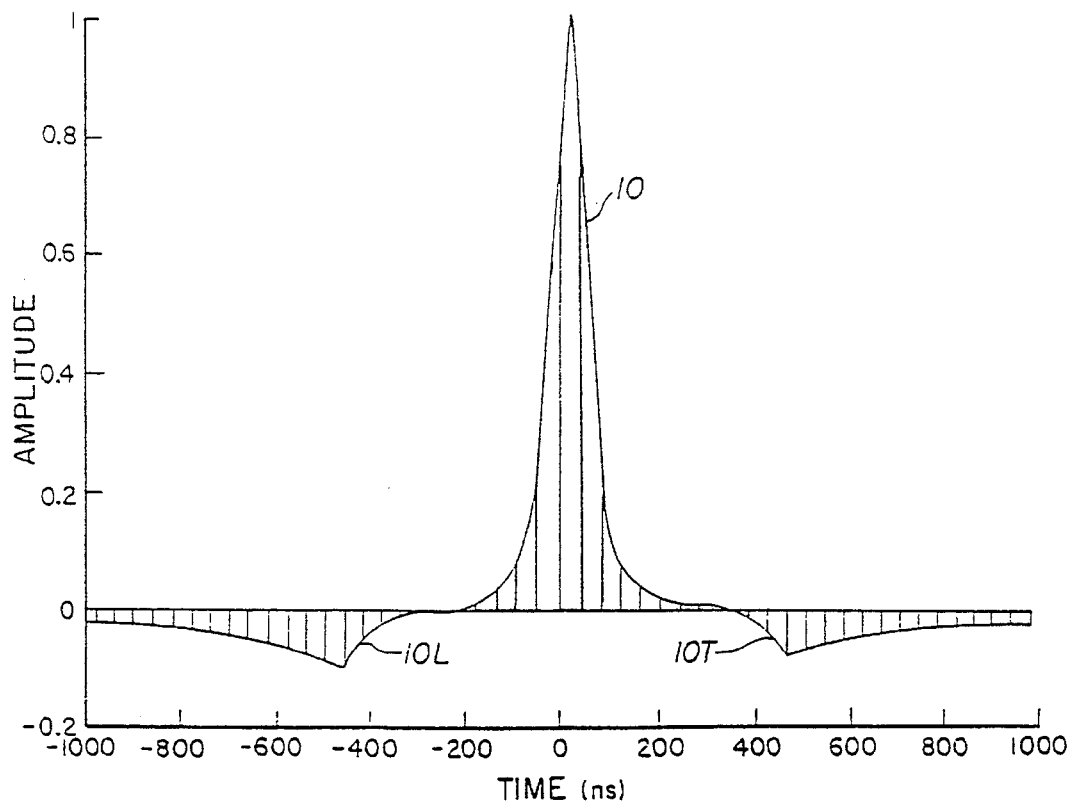
FIG. 1C illustrates the isolated pulse of FIG. 1A together with discrete samples describing the pulse.

While FIG. 1B illustrates the desired wave form and digital samples thereof for input to a detector, FIG. 1C is a representation of what may actually result showing the undershoots 10L and 10T. In producing the narrowed pulse 10, the undershoot pulses 10L and 10T are also narrowed. However, as illustrated in FIGS. 1A and 1C, the undershoot pulses are typically wider than the main pulse. Note that pulse 10L in FIG. 1C is shown as encompassing many non zero sample periods even after a pulse slimming filter operation. The number of non zero sample periods in an undershoot pulse can vary significantly from head to head. Also, the leading and trailing undershoots can occur at a different number of sample periods from the main pulse and can vary from head to head.

Figure 1D:
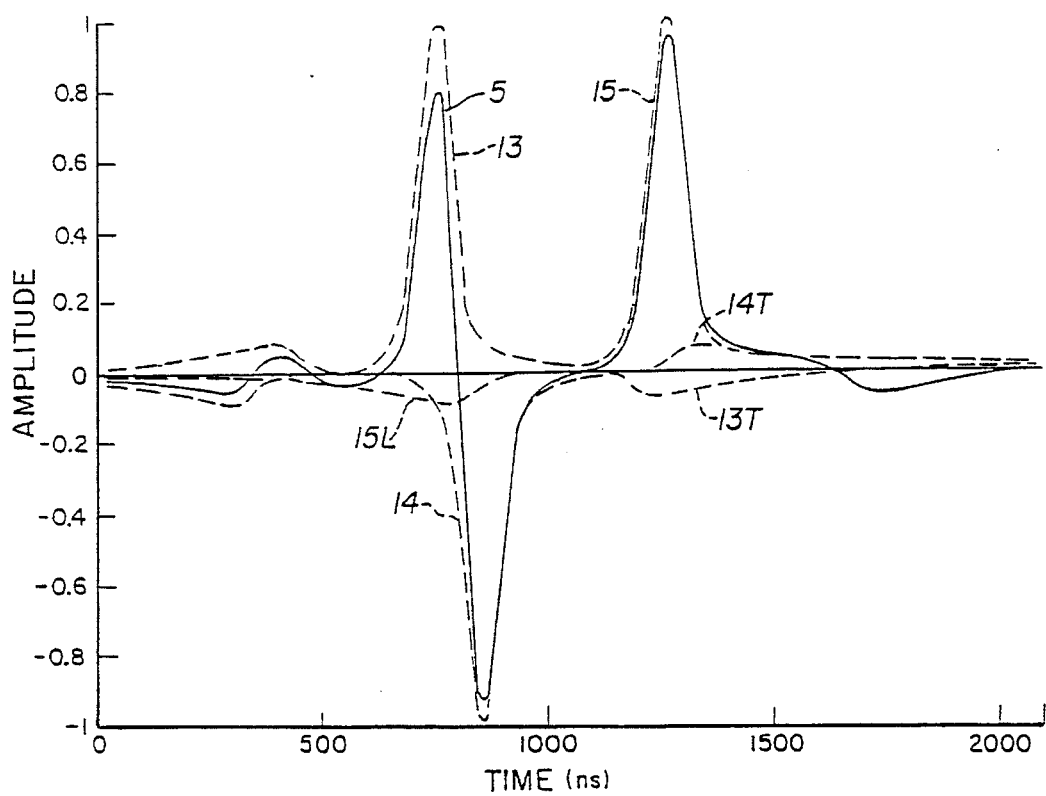
FIG. 1D illustrates the complexity of accurately reading a chain of pulses where the pulse to be read is diminished, increased, and/or shifted by the presence of undershoot pulses.

FIG. 1D is a representation of three successive pulses, 13–15, produced from successive transitions on the magnetic media intended to represent three successive one bits separated by varying runs of zero bits. Note that pulse 13 produces an undershoot 13T which detracts from the magnitude of pulse 15. Similarly, pulse 15 produces undershoot 15L which detracts from the magnitude of pulse 13. Pulse 14 produces an undershoot 14T which tends to increase and shift the position of pulse 15. The result of a summation of all of these pulses is illustrated by the solid line waveform 5 and shows that the summation can result in faulty detection due to reductions in amplitude as well as tending to shift the pulse into a neighboring bit time period. These effects may be accentuated by other noise within the system and result in misreading of the information recorded. FIG. 1D illustrates the desirability of eliminating at least the major amplitude samples of the undershoot pulse.

Figure 2:
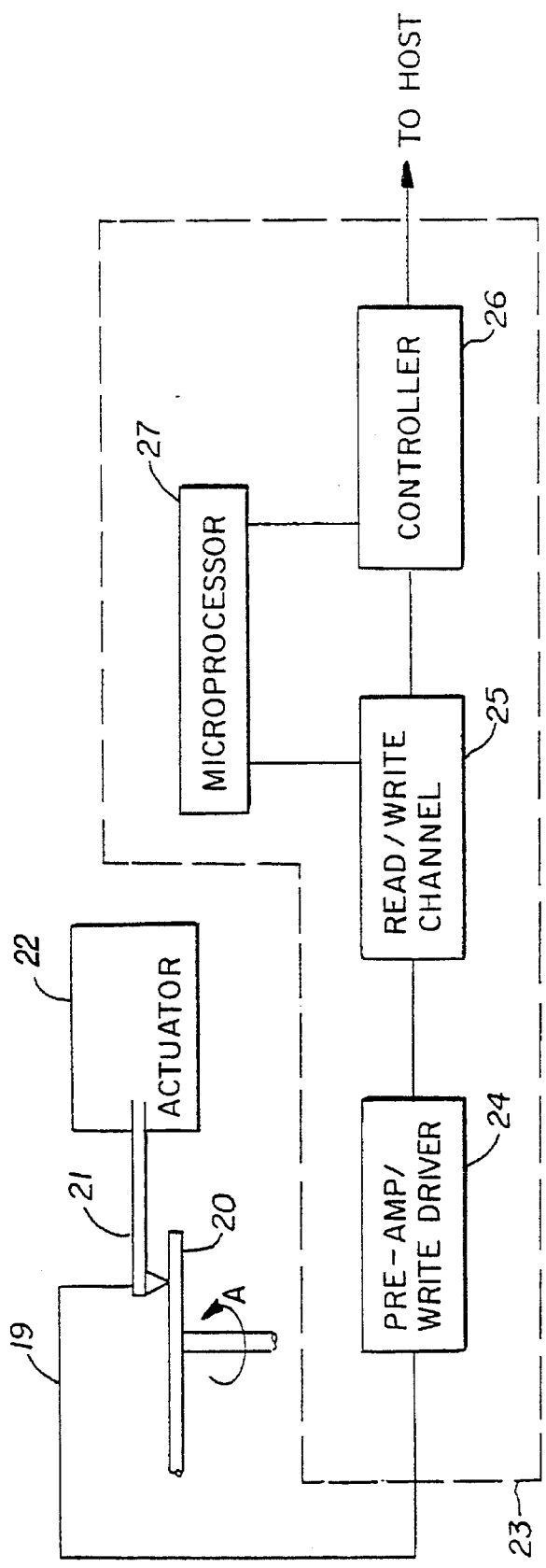
FIG. 2 is a block diagram of a drive electronics unit for a magnetic disk drive.

FIG. 2 shows a magnetic disk 20 rotating in the direction A under a read/write head 21. Head 21 is positioned over the track to be written or read by actuator 22. During the read operation electrical signals produced by head 21 are sent over line 19 to the drive electronics unit 23 for amplification, detection, decoding, and presentation to the host which has requested the information from the magnetic storage unit. Major components in drive electronics unit 23 include the pre-amp/write driver 24, a read/write channel 25, a controller 26, and a microprocessor 27 to exercise control over the components in the read/write channel 25 and the controller 26.

Figure 3:
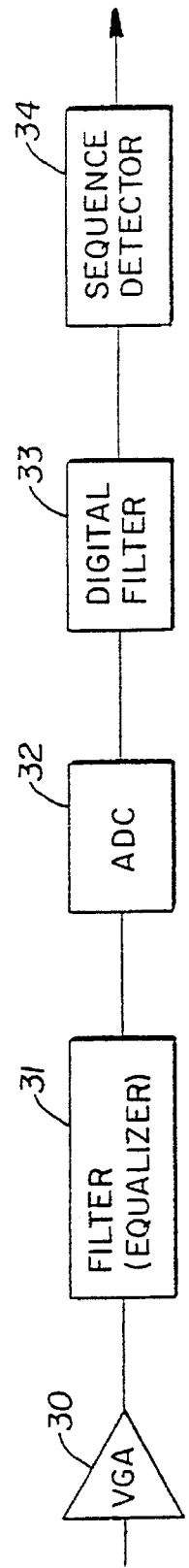
FIG. 3 is a block diagram of those elements in the read/write channel which receive, shape, and digitize the pulse for presentation to the sequence detector.

FIG. 3 shows some of the main components in the read/write channel 25 including a variable gain amplifier (VGA) 30, an analog filter 31, an analog to digital converter (ADC) 32, a digital filter 33, and a sequence detector 34. Read/write channels of the prior art generally provide output of a circuit such as the analog filter 31 directly to a detector which instead of a sequence detector is normally a peak detector to produce the digital signals read from the storage media. In apparatus associated with this invention, a sequence detector 34 receives the sample values representing the spectrally smoothed output and provides a comparison of those values representing several sequential digitized pulses to values representing all the possible idealized sequences which the sequential pulses can take. The filter of this invention can also be used with other types of detectors.

The present invention uses a digital filter having a particular impulse response to attenuate the pre-cursive and post-cursive secondary pulses generated when reading magnetic media with a magnetic read head. The delay and magnitude of the compensation taps of the digital filter are programmable, therefore the impulse response can be optimized for a given system by adaptively adjusting the delay and magnitude of the compensation taps. Further, the pre-cursive correcting portion of the filter can be disabled thereby avoiding the delay associated with that portion. Disabling the pre-cursive correcting portion is necessary when the delay cannot be tolerated in a particular system.

Figure 4:
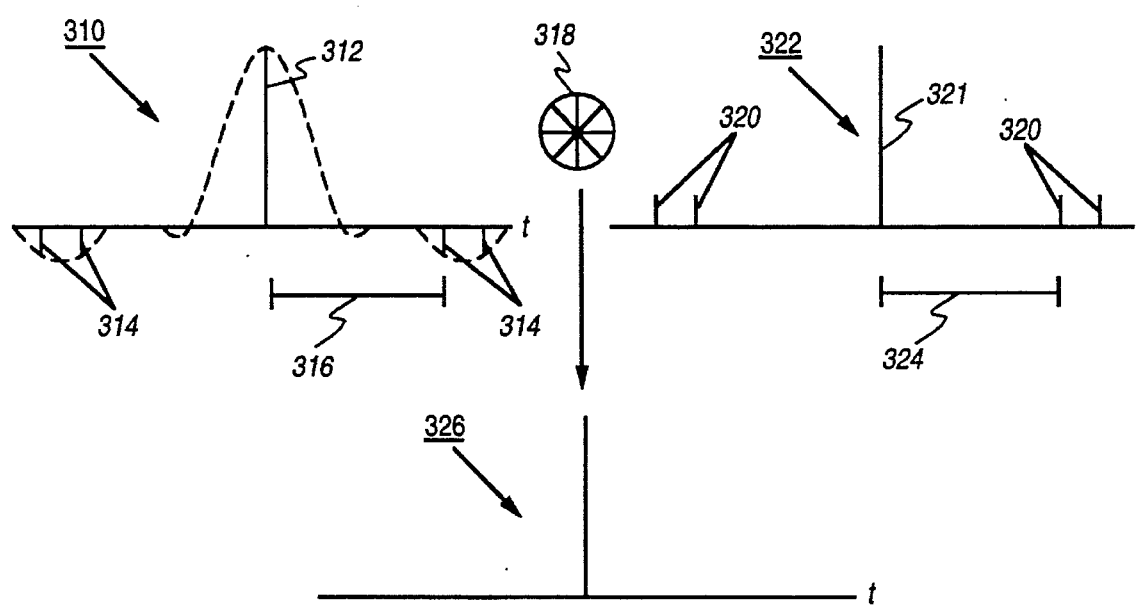
FIG. 4 depicts the impulse response of the digital filter in the present invention convolved with the sample input signal to cancel the secondary pulses.

FIG. 4 shows an overview of the sampled input signal 310 convolved 318 with the impulse response 322 of the filter in the present invention to achieve the desired output signal 326. As discussed previously, the sample from the main pulse 312 is preceded and followed by the samples of the undesired secondary pulses 314. The digital filter is adjusted so that the amplitude and delay of the compensation taps 320 will cancel the secondary pulses when convolved with the sample of the main pulse 312. The process of canceling the secondary pulses by convolving the input signal with the impulse response of the filter is described in detail in FIGS. 5 and 6.

Filtering an input signal means convolving it in the time domain with the impulse response of the filter. The convolution algorithm for discrete-time signals is characterized by the following equation:

$$h(n) = \sum_{k=0}^{N-1} w(k) \cdot x(n-k)$$

where $x(n)$ is the sampled input signal, $w(n)$ is the impulse response of the filter, and $h(n)$ is the resulting convolution.

Graphically, a convolution can be represented by shifting a mirror image of the input signal over the impulse response of the filter while multiplying and adding the result at each sample period as shown in FIGS. 5A through 5F.

Figure 5A:
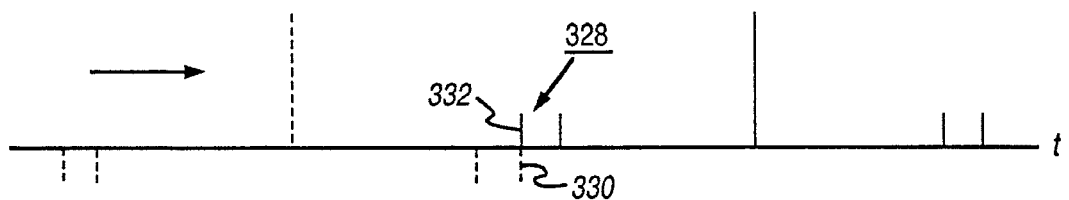
FIGS. 5A through 5F depict a detailed illustration of the convolution process for canceling the secondary pulses where the input signal comprises one sample value for the main pulse and two sample values for the secondary pulses.

FIG. 5A shows the first non-zero multiplication 328 of the sample of the pre-cursive secondary pulse 330 by the first compensation tap 332 of the filter. Because the sample values of the secondary pulse 330 and the compensation tap 332 have a fractional magnitude, and because the multipliers in the filter have finite precision, the result of the multiplication is effectively zero. For instance, if the sample value of the secondary pulse is $1/32$, and the value of the compensation tap is $1/32$, then the resulting multiplication is $1/1024$ which is beyond the precision of the multiplier and therefore rounded to zero. This is a significant characteristic of the filter since the desired output is zero except for the sample value of the main pulse.

Figure 5B:
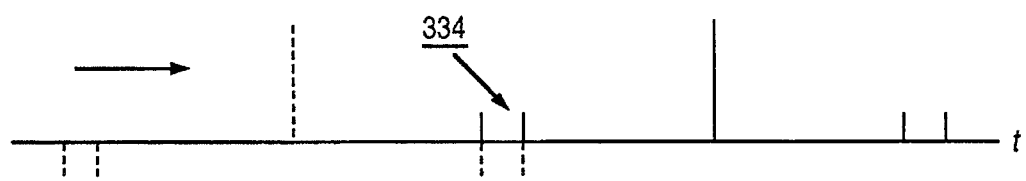

FIG. 5B shows the convolution at the next sample period where the output of the filter is the summation of both sample values of the secondary pulses multiplied by the compensation taps of the filter 334. Again, since the multipliers in the filter have finite precision, the output is still zero as desired.

Figure 5C:
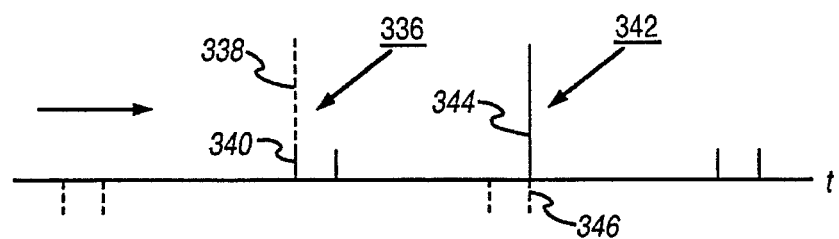
Figure 5D:
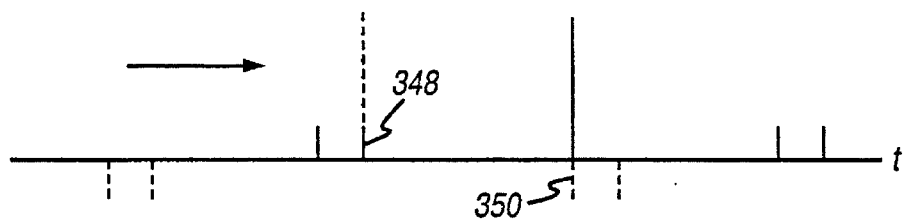

FIG. 5C shows the progression of the convolution to the point where the first sample value from the pre-cursive secondary pulse 346 has reached the center tap 344 of the filter, and where the sample value of the main pulse 338 has reached the first compensation tap 340 of the filter. The value and sign of the compensation tap 340 are adjusted so that when multiplied 336 by the main pulse 338 the result is opposite in sign and equal in magnitude to the secondary pulse 346. When added together, the sample value of the secondary pulse is effectively canceled by the attenuated main pulse. As shown in FIG. 5D, the second sample value from the pre-cursive pulse 350 is canceled in the same manner by the second compensation tap 348.

Figure 5E:
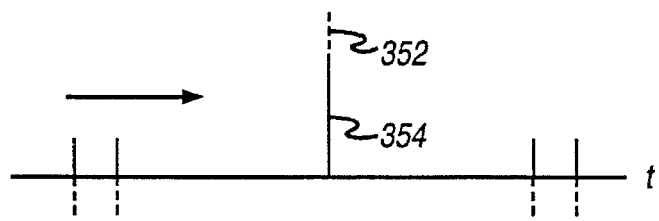
Figure 5F:
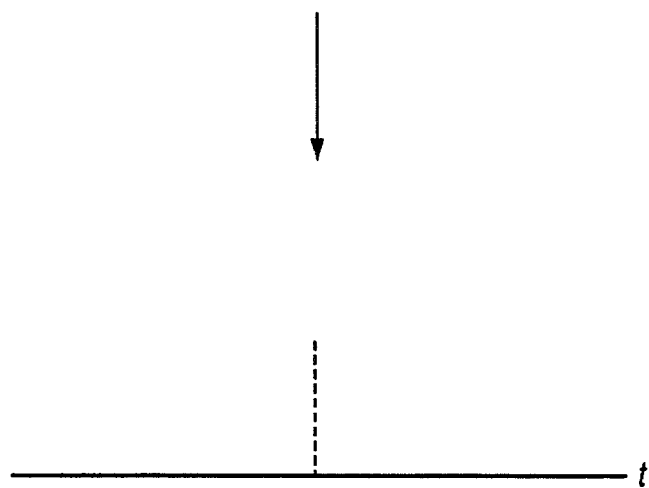
Figure 6A:
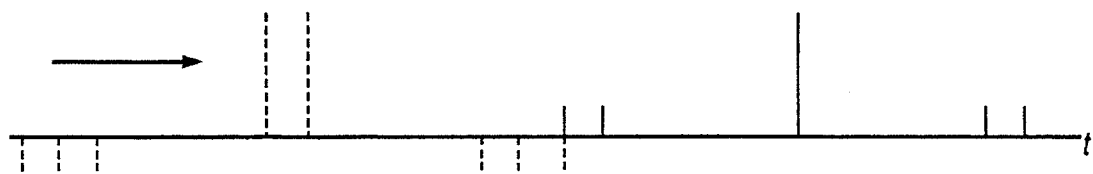
FIG. 6A through 6J depict a detailed illustration of the convolution process for canceling the secondary pulses where the input signal comprises two sample values for the main pulse and three sample values for the secondary pulses.
Figure 6B:
Figure 6C:
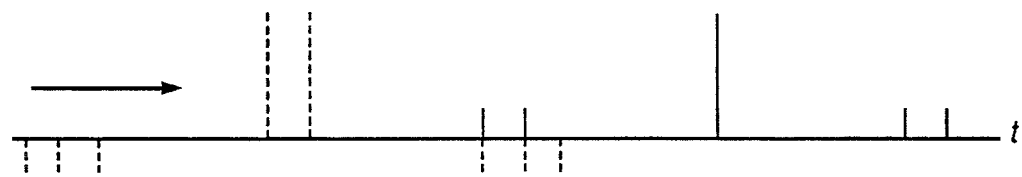
Figure 6D:
Figure 6E:
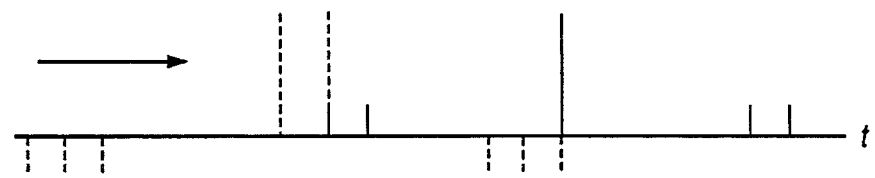
Figure 6F:
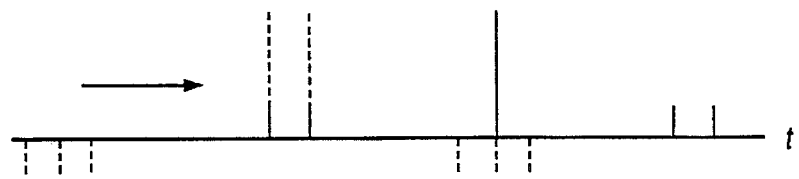
Figure 6G:
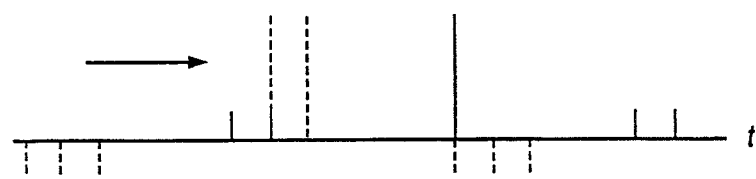
Figure 6H:
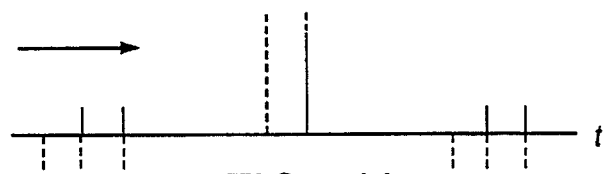
Figure 6I:
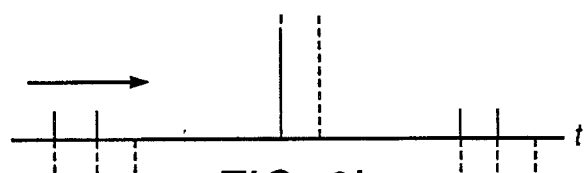
Figure 6J:
Figure 6J:
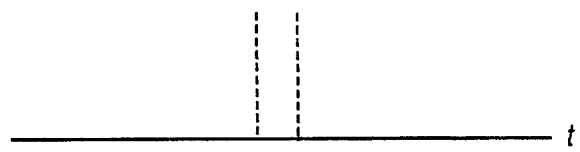

FIG. 5E shows the progress of the convolution where the sample value of the main pulse 352 has reached the center tap of the filter 354. The magnitude of the center tap 354 is one, and when multiplied by the sample value of the main pulse 352 the output of the filter is the main pulse as desired. The sample values of the post-cursive secondary pulse 314 are canceled by the third and fourth compensation taps 320 of the filter in the same manner the pre-cursive secondary pulse is canceled. The final output, as shown in FIG. 5F, is the sample value of the main pulse with the secondary pulses eliminated.

By adding additional compensation taps, the filter of the present invention can operate on a discrete time input signal having more than two samples for the secondary pulse. For an input signal with one sample value for the main pulse, as in FIG. 4, the number of compensation taps equals the number of sample values for the secondary pulse (e.g. two in FIG. 4).

The filter of the present invention is also not limited to an input signal having only one sample for the main pulse. FIGS. 6A through 6J illustrate the convolution for canceling secondary pulses represented by three sample values where the main pulse is represented by two sample values. Again, the compensation taps are delayed and scaled to cancel the sample values of the secondary pulses.

In a preferred implementation a sensed pulse is amplified, filtered, digitized, and presented to a digital filter for the production of undershoot compensation and resulting in the smoothing of the frequency spectrum. A finite impulse response filter (FIR) of a particular configuration provides a digital delay line with a first group of taps followed by a programmable delay line without interior taps. A second programmable digital delay line is followed by a second group of taps, each tap feeding an adder circuit after passing through attenuation circuits. By choosing appropriate delays and attenuation factors, an isolated pulse is time and magnitude transferred and possibly filtered in order to compensate for the pole tip effect or similar secondary pulse generating conditions. A portion of a FIR filter 33 utilized for such compensation is shown in FIG. 7.

Figure 7:
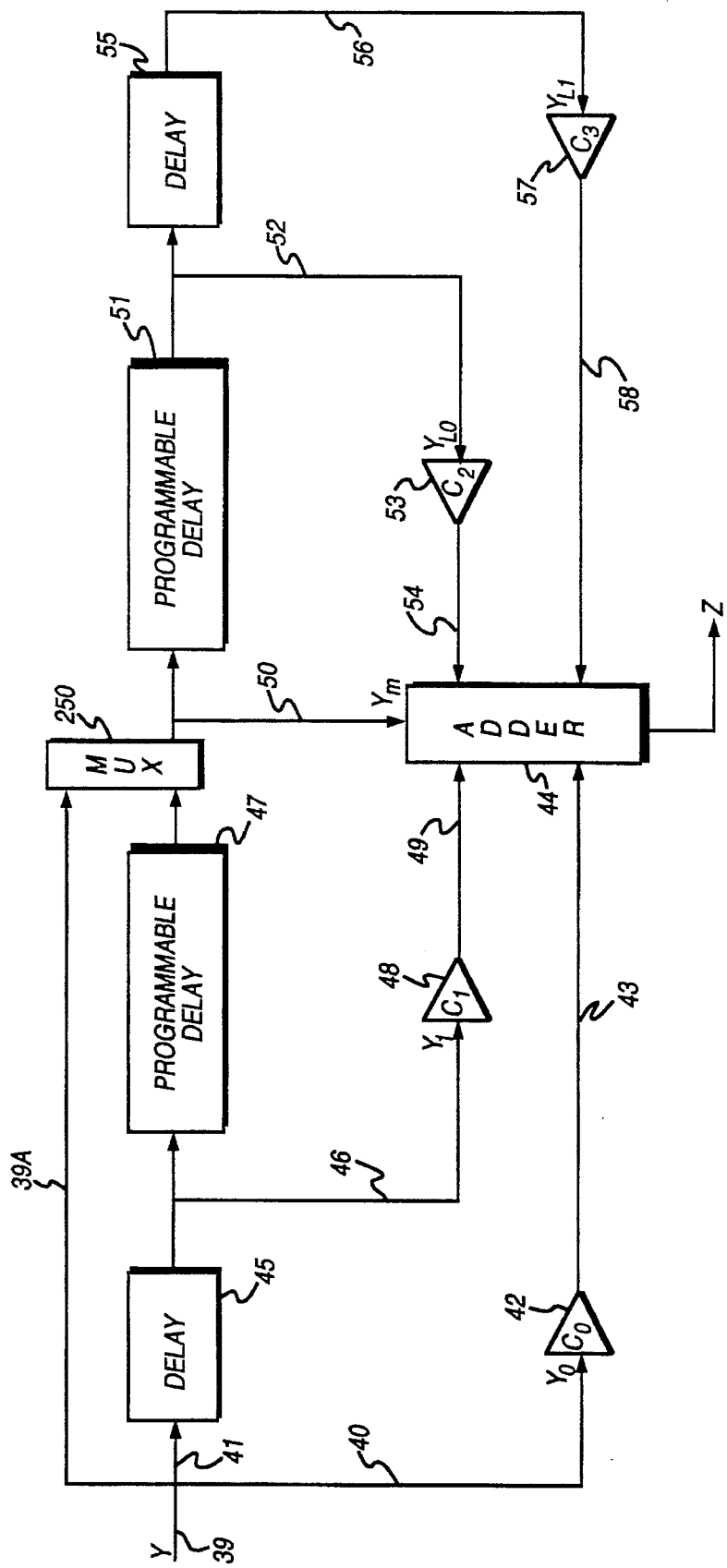
FIG. 7 is a block diagram of those components of the digital filter which are designed to smooth out the digitized signal for presentation of the signal to the detector.

In FIG. 7 the signal stream of digitized sample values is received over line 39. The digital sample values are passed through a multiplexor 250 for disabling the pre-cursor portion of the filter. Multiplexor 250 is programmed to send the digital samples over line 41 through the pre-cursive correcting portion of the filter, or over line 39a thereby bypassing the pre-cursive correcting portion. If the pre-cursor correcting portion is bypassed, the post-cursive correcting portion is still operable and the input signal is provided at the output of the adder 44 with virtually no delay. If the pre-cursor correcting portion is not bypassed, then both secondary pulses are attenuated.

To illustrate, a particular sample value, Y, is passed over tap 40 as signal $Y_0$, and multiplied by a coefficient $C_0$ by circuit 42. $Y_0C_0$ is then provided as an input over line 43 to the adder 44. Signal Y is also presented over line 41 to a delay circuit 45. A delayed signal, $Y_1$, is sent over tap 46 to a multiplier 48 for obtaining the attenuated signal value, $Y_1C_1$. That signal is provided to adder 44 over line 49.

Signal Y is delayed still further by a programmable delay circuit 47. Signal $Y_M$, the output of delay circuit 47, is provided to the adder 44 over tap 50 as an unattenuated sample value, $Y_M$. Signal Y is also passed to the programmable delay line circuit 51 and then over tap 52 as signal $Y_{L0}$ to a multiplier circuit 53 for attenuation by coefficient $C_2$. Signal $Y_{L0}C_2$ is advanced to the adder 44 over line 54. Signal Y is passed still further to delay circuit 55, the output of which is passed over tap 56 as signal $Y_{L1}$ to multiplying circuit 57 for attenuation by coefficient $C_3$. The signal $Y_{L1}C_3$ is then provided over line 58 to adder 44. The multiplying circuits 42, 48, 53 and 57 can each be programmed under control of the microprocessor to produce a desired attenuation value so that the output sample Z, takes the correct amplitude to attenuate the effect of the undershoot. Note that the signal $Y_M$ presented to the adder over tap 50 is not attenuated, but it could be attenuated or magnified if desired dependent upon the implementation of the invention.

The operation of the circuit shown in FIG. 7 to compensate the magnitude of undershoot samples is as follows. As mentioned above, the sample value entering the adder over line 50 does not pass through an attenuation circuit and hence the center sample $Y_M$ is the value which enters the circuit over line 39. Suppose, for example, that the sample value on line 50 is a sample from the maximum amplitude of an isolated pulse. That value may be passed directly through the circuit of FIG. 7 to provide the isolated pulse sample value to the detection circuit. That is accomplished by setting the coefficients $C_0$–$C_3$ all to zero.

When the circuit of FIG. 7 is used to compensate the leading undershoot, a sample value corresponding to a maximum amplitude of that preceding undershoot is time delayed through circuits 45 and 47 such that $Y_M$ takes the value of the maximum amplitude of the leading undershoot. If the programmable delay circuit 49 is adjusted properly the signal $Y_M$ entering the adder over line 50 will correspond in time to a sample of the maximum amplitude of the isolated pulse which is on tap 40 as signal $Y_0$. That magnitude is attenuated by multiplier 42 such that the signal provided to the adder over line 43 corresponds in value to the signal on line 50. Adding the two together can substantially reduce the undershoot signal and in that manner tend to eliminate its effect. Sample values from taps 46, 52, and 56 can be used to fine tune the product of the adder.

In a similar manner the maximum sample value of the trailing undershoot is compensated when it appears on tap 50 as a signal $Y_M$ to the adder. In this instance the maximum sample value of the isolated pulse will have passed through delay circuits 51 and 55 such that if programmable delay 51 is adjusted properly, the maximum sample from the isolated pulse appears on line 56 at the same time as the trailing undershoot maximum sample appears on line 50. By attenuating the magnitude of the isolated pulse sample with multiplying circuit 57 the sample on tap 50 is substantially compensated. Again, taps 40, 46, and 52 may be used to fine tune the compensation and virtually eliminate the undershoot sample.

As illustrated in FIG. 1A the undershoot pulses are not shaped the same as the isolated main pulse. Generally they have wider shape with maximum amplitude values ranging from 3 to 10% of the maximum sample values of the main pulse. To completely eliminate the undershoot would require a complex delay line structure with many taps. By using a five tap circuit several of the largest magnitude samples in the undershoot may be compensated and in that manner, the main part of the undershoot may be eliminated and the rest can be ignored. If desired, additional samples could be compensated by increasing the number of taps.

Figure 8:
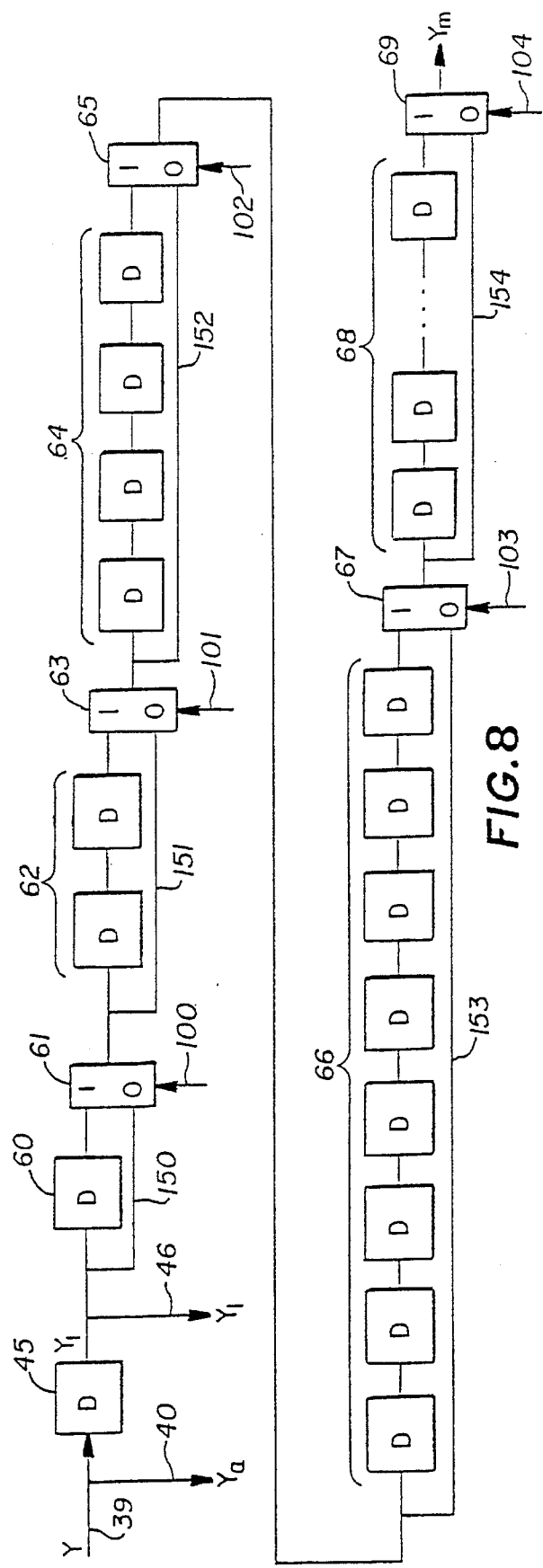
FIG. 8 is a detail diagram of the programmable delay line shown in FIG. 7.

FIG. 8 shows the details of the programmable digital delay circuit 47. As shown, the output of delay circuit 45 enters programmable delay 47 and may pass through one bit delay circuit 60 if multiplexor 61 is set by microprocessor 27 to select a path through circuit 60. If the microprocessor 27 establishes a high value (one value) on control line 100, delay line 60 is ;selected by the multiplexor 61. If microprocessor 27 establishes a low value (zero value) on control line 100 multiplexor 61 selects bypass line 150 around delay line 60. The output of multiplexor 61 is either passed through a two bit delay circuit 62 or bypassed around the two bit delay over line 151 by virtue of the selection of multiplexor 63. Multiplexor 63 is set by microprocessor 27 through a high or low value on control line 101.

Control line 102 establishes the selection for multiplexor 65 such that the output of multiplexor 63 is either passed through a four bit delay 64 or bypassed around delay 64 over line 152 according to the selection established at the multiplexor 65. Similarly, control line 103 establishes the selection by microprocessor 27 of either the eight bit delay 66 or a bypass of the eight bit delay over line 153. Control line 104 establishes the selection of multiplexor 69 to select either an eight bit delay 68 or a line 154 bypassing that eight bit delay. The output of multiplexor 69 is the signal $Y_M$.

Through the proper selection of delay elements by control lines 100–104, it is evident that the programmable delay 47 can in theory achieve a total delay of zero to 23 bits. In an actual implementation, one or two unavoidable circuit delays may result in a range of 1–24 or 2–25 bits.

While FIG. 8 illustrates a zero to 23 bit digital delay circuit corresponding to the programmable delay circuit 47 the same structure is also used for the programmable delay circuit 51. In the instance of sample delay circuit 51 the output pulse is $Y_{L0}$ rather than $Y_M$.

FIG. 8 shows that the delay line 47 is comprised of a long string of delays without taps. The amount of delay without taps can extend from zero to 23 time periods. The provision of such a feature within the filter of this invention results from the recognition that no compensation is needed between the main isolated pulse and the undershoot. Therefore, additional taps, multipliers, and inputs to adders are avoided without incurring degraded performance.

Figure 9:
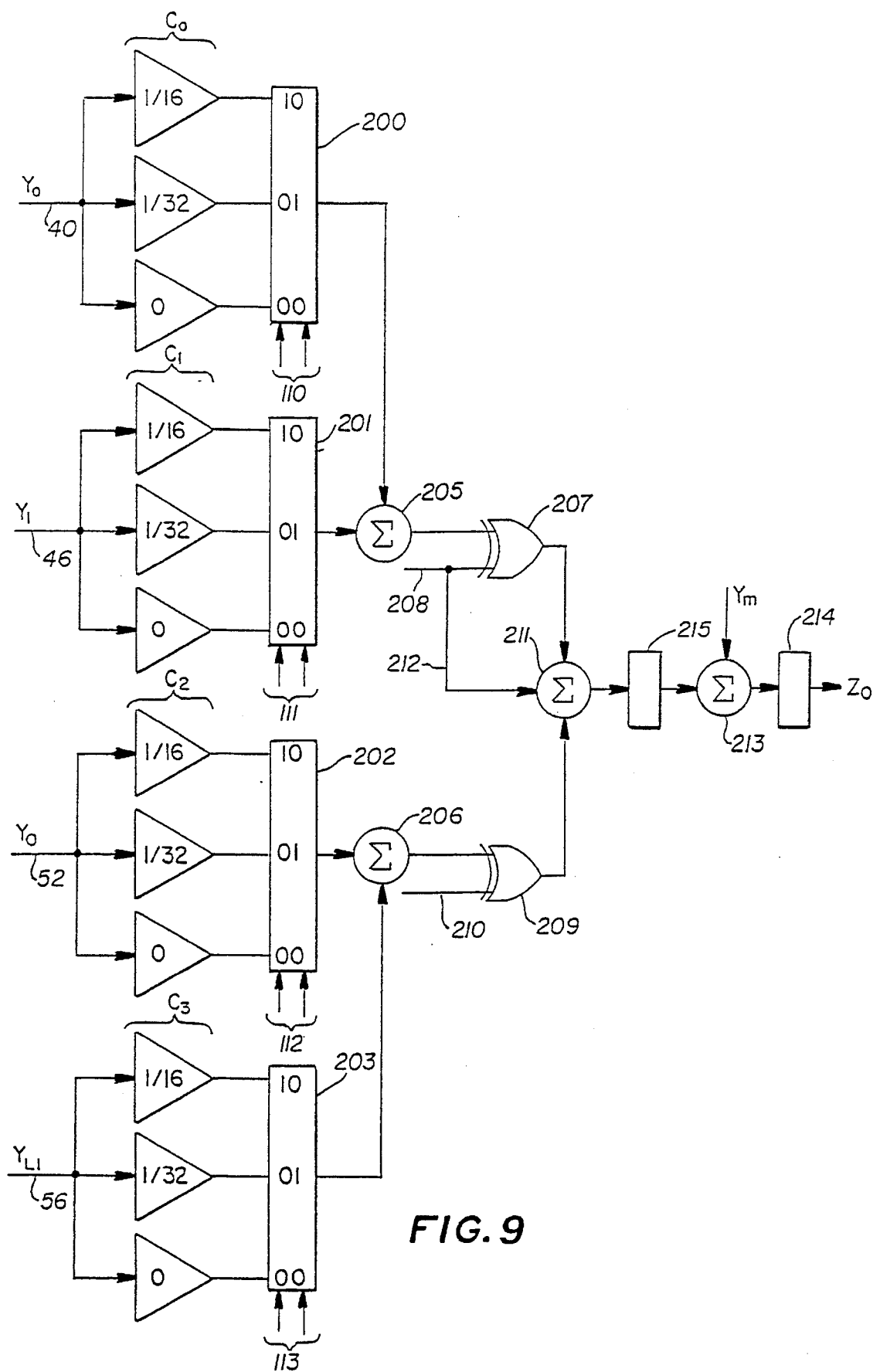
FIG. 9 is a detail diagram of the attenuation and adder circuits for multiplying the various signals from the tapped delay line of FIG. 7 and adding the delayed signals to produce a compensated smooth output.

FIG. 9 is a detailed circuit representation of the multiplier and adder circuits which are used to attenuate the isolated sample values to a degree sufficient to compensate the undershoots. In FIG. 9 the control lines 110 establish a selection in multiplexor 200 of the multiplier to be used for the input signal on line 40, $Y_0$. As shown in FIG. 9 three selections can be made. $Y_0$ is multiplied by coefficient, $C_0$, which can take a value of 1/16, a value of 1/32, or zero. Similarly, signal $Y_1$ on line 46 may also be multiplied by a coefficient $C_1$ with a value of 1/16, 1/32, or zero depending upon the selection made in multiplexor 201 through control lines 111. FIG. 9 also shows that control lines 112 select the value of coefficient $C_2$ through multiplexor 202 for the signal $Y_{L0}$ appearing on line 52. Again the value of the coefficient is either 1/16, 1/32, or zero. Similarly, control lines 113 select the value of coefficient $C_3$ for signal $Y_{L1}$ appearing on line 55 by selecting one of three values through multiplexor circuit 203. Again the selection is either a value of 1/16, 1/32, or zero.

The outputs of multiplexors 200 and 201 are fed to adder circuit 205 while the outputs of multiplexors 202 and 203 are fed to adder 206. The output of adder 205 is exclusive OR'ed with a sign signal on line 208. The signal on line 208 is set by microprocessor 27 to indicate either a positive or a negative value depending on the needed direction of compensation. In MIG heads, the desired direction of compensation is different from the direction needed for thin film heads. Similarly, the output of summation circuit 206 is exclusive OR'ed at circuit 209 with a sign signal on line 210. The outputs of exclusive OR circuits 207 and 209 are added in summation circuit 211 together with a carry signal on line 212 to complete the two's complement sign inversion of the output of adder 205.

The output of summation circuit 211 is provided to adder 213 through pipeline register 215 for addition with the signal $Y_M$. The output of summation circuit 213, is passed through saturation circuit 214 to provide an output signal $Z_0$, which is fed to the detector circuit for further processing. Signal $Z_0$ may be represented as follows:

$$Z_0 = Y_0 C_0 + Y_1 C_1 + Y_{L0} C_2 + Y_{L1} C_3 + Y_M$$

In one embodiment of the device, each input signal quantity $Y_0$, $Y_1$, $Y_{L0}$, $Y_{L1}$, and $Y_M$ is a six bit quantity as is the output signal $Z_0$. The detailed mathematical progression of quantities through the circuit of FIG. 9 for that implementation is shown below:

| | | |
|---|---|---|
| $Y_0 =$ (1) | sx.xxxx | six bit input |
| $Y_1 =$ (2) | sx.xxxx | six bit input |
| $Y_0 * 1/16 =$ (3) | --.--sxxxxx | |
| $Y_1 * 1/16 =$ (4) | --.--sxxxxx | |
| output of 200 = (5) | --.--sxxxxxx | low bit used as carry-in |
| output of 201 = (6) | --.--sxxxxxx | low bit is ignored |
| output of 205 = (7) | --.-sxxxxxx | |
| output of 206 = (8) | --.-sxxxxxx | |
| output of 211 = | --.sxxxxxxx | low 3 bits are ignored |
| $Y_M =$ (9) (10) | sx.xxxx1 | low bit of 1 is appended |
| output of 213 = (11) | sxx.xxxxx | low bit is ignored |
| $Z_0 =$ (12) | sx.xxxx | six bit output |

Note that $Y_0$, $Y_1$, and $Y_M$ shown on lines 1, 2 and 10 are six bit signed input quantities. Since the circuit of FIG. 9 calls for a multiplication by either 1/16 or 1/32, the factor 1/16 is a common multiplier which shifts the input quantity four binary places as shown on lines 3 and 4. The remaining multiplication factor can be either 1 or 1/2 resulting in the addition of seven bit quantities as shown on lines 5 and 6. However, adders 205 and 206 can be implemented as six bit input signed adders by using the right-most bit of the output of multiplexor 200 as a carry-in and ignoring the right-most bit of the output of multiplexor 201. The output signal of adder 205 is shown on line 7 as a seven bit signed quantity which is added to the output of adder 206 by seven bit input signed adder 211. The output signal of adder 211 is an eight bit signed signal shown on line 9 for summation in adder 213 with input quantity $Y_M$ (line 10). Adder 213 may be implemented as a seven bit in eight bit out adder by ignoring the right-most three bits on line 9 since they are insignificant to the final result. Pipeline register 215 may be inserted to limit carry propagation through adder 213. A right-most one bit is inserted on line 10 for rounding in obtaining the output signal of adder 213 shown on line 11.

In a particular implementation, the downstream circuits may be built to handle six bit signed quantities. Therefore, the output signal, $Z_0$, should take the form sx.xxxx. Such a quantity is likely to be the output signal from adder 213 but, as can be seen on line 11, there is a possibility of a greater quantity as a result of adding the signal $Y_M$. This can occur despite the fact that the value of $Y_M$ is established upon assembly as a value of "one" or close thereto. However, a noise spike or a gain problem could theoretically send the input quantity $Y_M$ to a value of "two". Adding in the output of adder 211 can result in an output signal (line 11) as high as 2 1/4. Such a quantity cannot be expressed as a six bit signed signal $Z_0$, of the form sx.xxxx and therefore cannot be handled by downstream circuits. While such a situation is unlikely to occur, saturation circuit 214 is present to field the situation and produce an output signal in its desired format.

An alternative embodiment of the present invention is to use an Infinite Impulse Response filter (IIR filter) that has the desired impulse response. The benefit of using an IIR filter rather than a FIR filter is that only one programmable delay line is needed due to the use of feedback. Obviating the second programmable delay line by using feedback reduces the size and cost of the circuit. Further, the IIR implementation retains the ability to selectively disable the pre-cursive correcting portion of the filter, and additionally provides both the fully corrected output and the post-cursive only corrected output for subsequent simultaneous processing.

Figure 10:
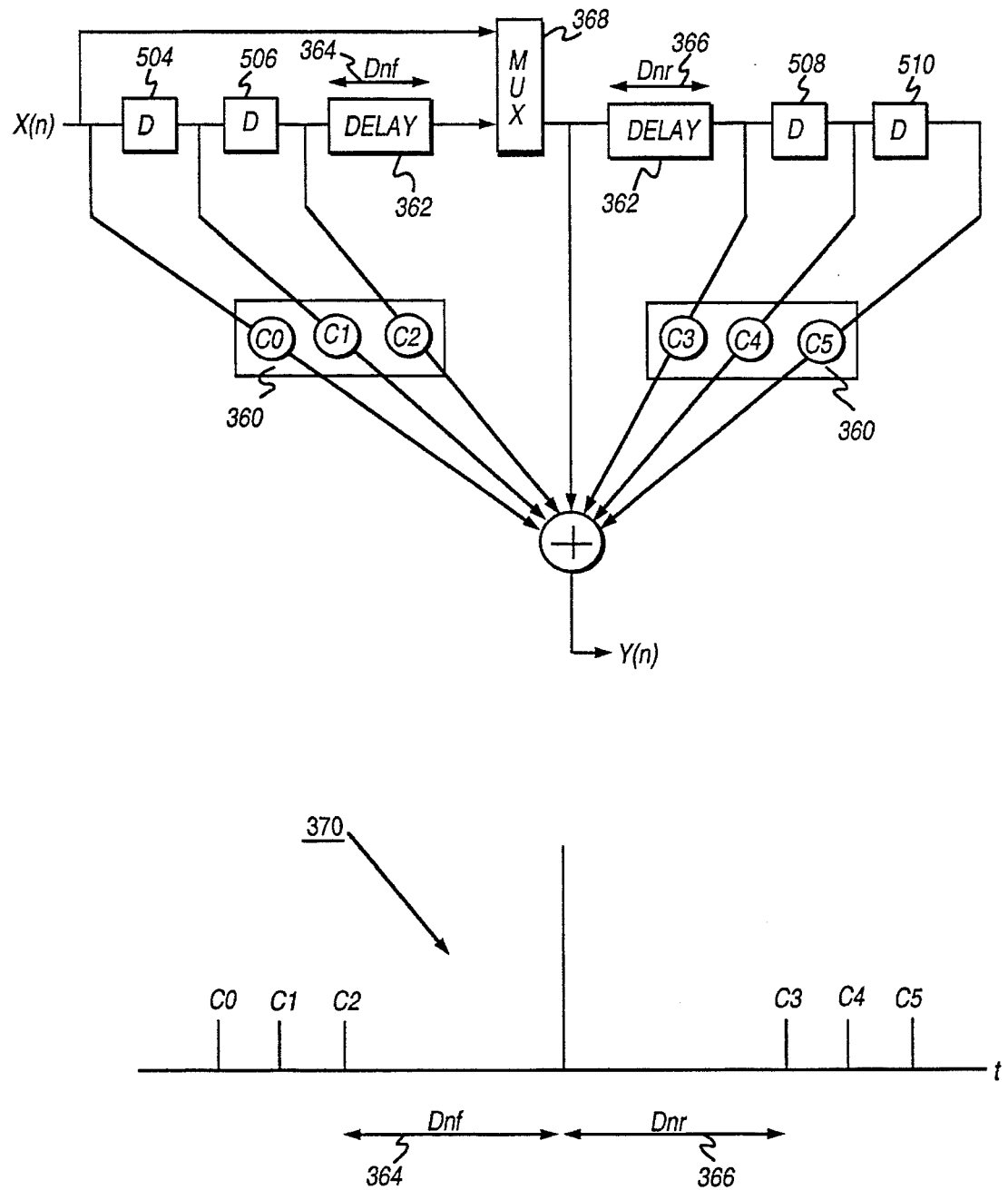
FIG. 10 is a detail diagram of the FIR filter of the present invention and its impulse response.
Figure 11:
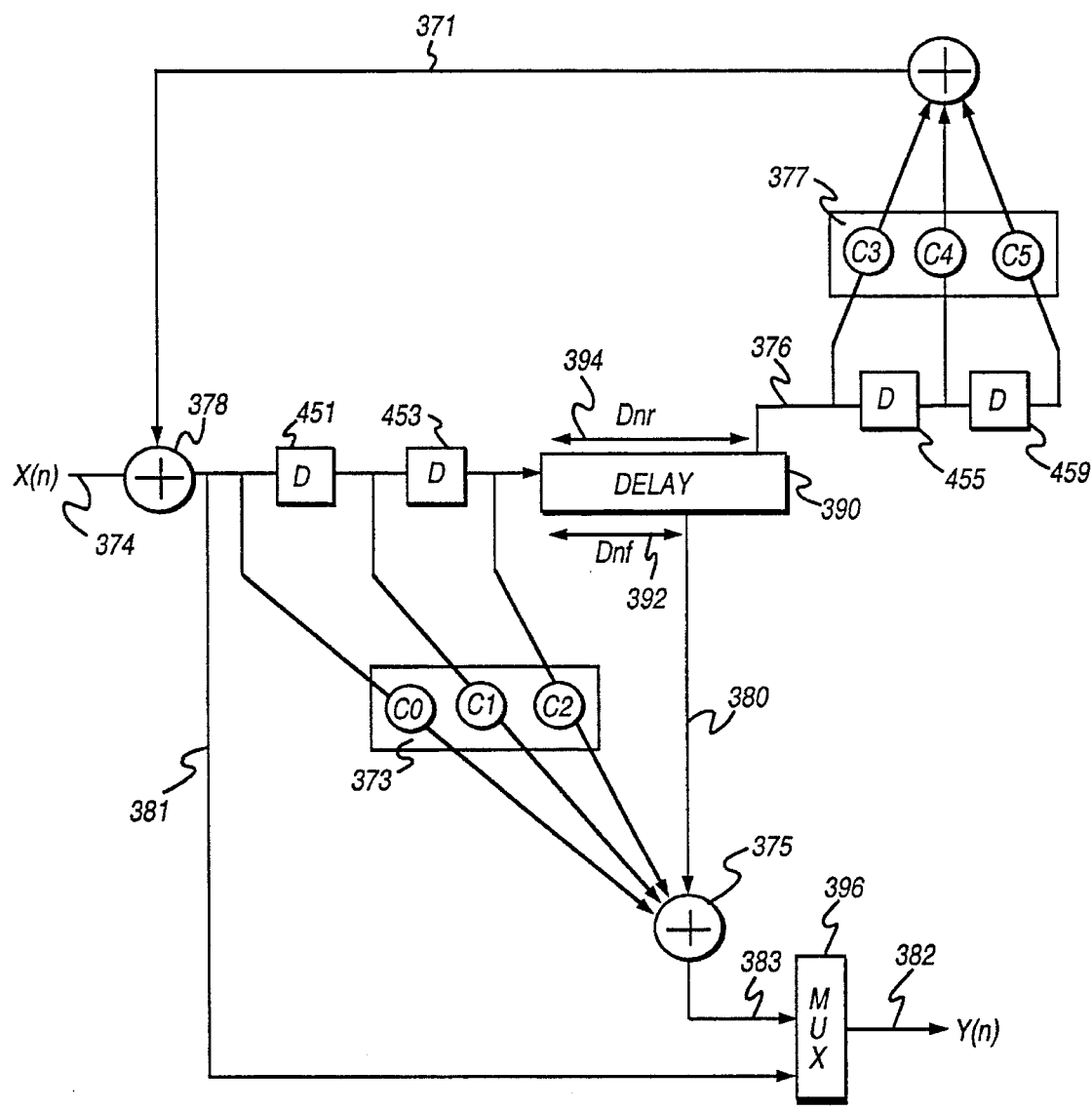
FIG. 11 is a detail diagram of the IIR filter of the present invention and its impulse response.
Figure 11:
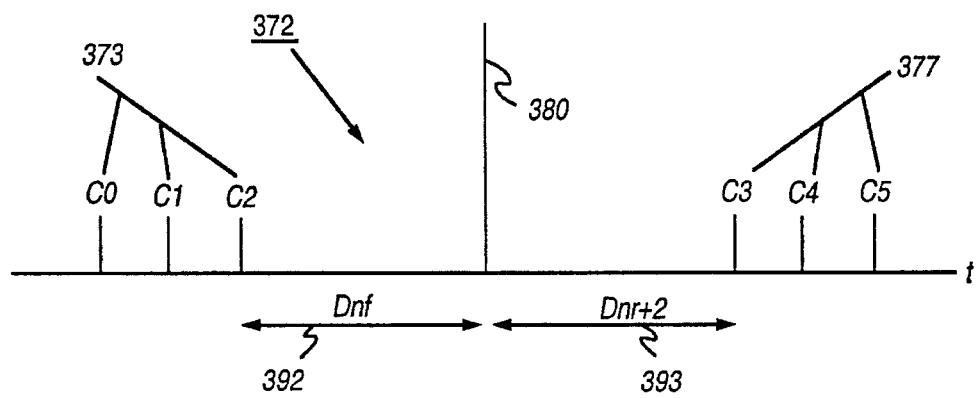

The IIR filter of the present invention as shown in FIG. 11 has a similar impulse response to that of the traditional FIR filter as shown in FIG. 10. The traditional FIR filter in FIG. 10 has six compensation taps 360 with coefficients C0 . . . C5 and two programmable delay lines 362 for generating the pre-cursor delay Dnf 364 and the post-cursor delay Dnr 366. Multiplexor MUX 368 is used to disable the pre-cursor correcting portion of the filter. The resulting finite impulse response 370 has the desired characteristic for canceling the secondary pulses of the input data stream. Although this implementation provides the desired impulse response, by using feedback a similar impulse response can be achieved using only one programmable delay line thereby reducing the size and cost of the circuit.

The preferred embodiment of the digital filter utilizing feedback is shown in FIG. 11. The pre-cursor correcting portion of the filter operates the same as the FIR implementation in FIG. 10 by convolving the main pulse with compensation taps 373 with coefficients C0 . . . C2 and canceling the pre-cursor samples at the center tap 380 through adder 375. However the post-cursor correcting portion is implemented by feeding back the delayed input X(n–Dnf-2) 376 convolved with the compensation taps 377 with coefficients C3 . . . C5 and adding the resulting convolution 371 to X(n) 374 at adder 378. Therefore the post-cursor samples are canceled as they enter the filter rather than when they reach the center tap 380 as in the FIR implementation in FIG. 10.

A filter incorporating feedback will normally have an infinite impulse response (IIR), however the IIR filter of the present invention still has the desired characteristics for attenuating the secondary pulses. By using feedback, the post-cursive correcting portion of the filter can share the same programmable delay line circuitry 390 used to generate the delay for the pre-cursive correcting portion of the filter, thereby obviating the need for two separate delay line circuits.

The infinite impulse response of the filter in FIG. 11 is characterized by:

$$\frac{C0 + C1D^1 + C2D^2 + D^{nf+2}}{1 - D^{(nr+2)o}(C3 + C4D^1 + C5D^2)}$$

where $D^{nf}$ 392 is the pre-cursor delay and $D^{(nr+2)}$ 393 is the post-cursor delay. Due to the fractional magnitude of the coefficients, the $C_jC_kD^m$ terms of the infinite impulse response are insignificant and the dominant terms in the impulse response are:

$$C0+C1D^1+C2D^2+D^{nf+2}+C3D^{nf+nr+4}+C4D^{nf+nr+5}+C5D^{nf+nr+6}.$$

Graphically, the impulse response 372 shown with the dominant terms only as in FIG. 11 is similar to the finite impulse response 368 of the traditional FIR filter shown in FIG. 10. Because the impulse response is similar, the desired attenuation of the secondary pulses is achieved when convolved with the input signal. In other words, as long as the filter has the desired impulse response it does not matter how the filter is internally implemented.

The pre-cursor correcting portion of the filter can be disabled by selecting the output 381 of adder 378 through multiplexor 396 as the filter output Y(n) 382. Disabling the pre-cursor correcting portion of the filter avoids delaying the input signal while still canceling the post-cursor pulses. If the output of the filter Y(n) 382 is connected through multiplexor 396 to the output 383 of adder 375, then both the pre-cursor and post-cursor pulses are canceled. Also, it may be desirable to process both the fully corrected and post-cursor only corrected outputs simultaneously, therefore the output from the filter can be taken from either line 381 or line 383 or both.

Figure 12:
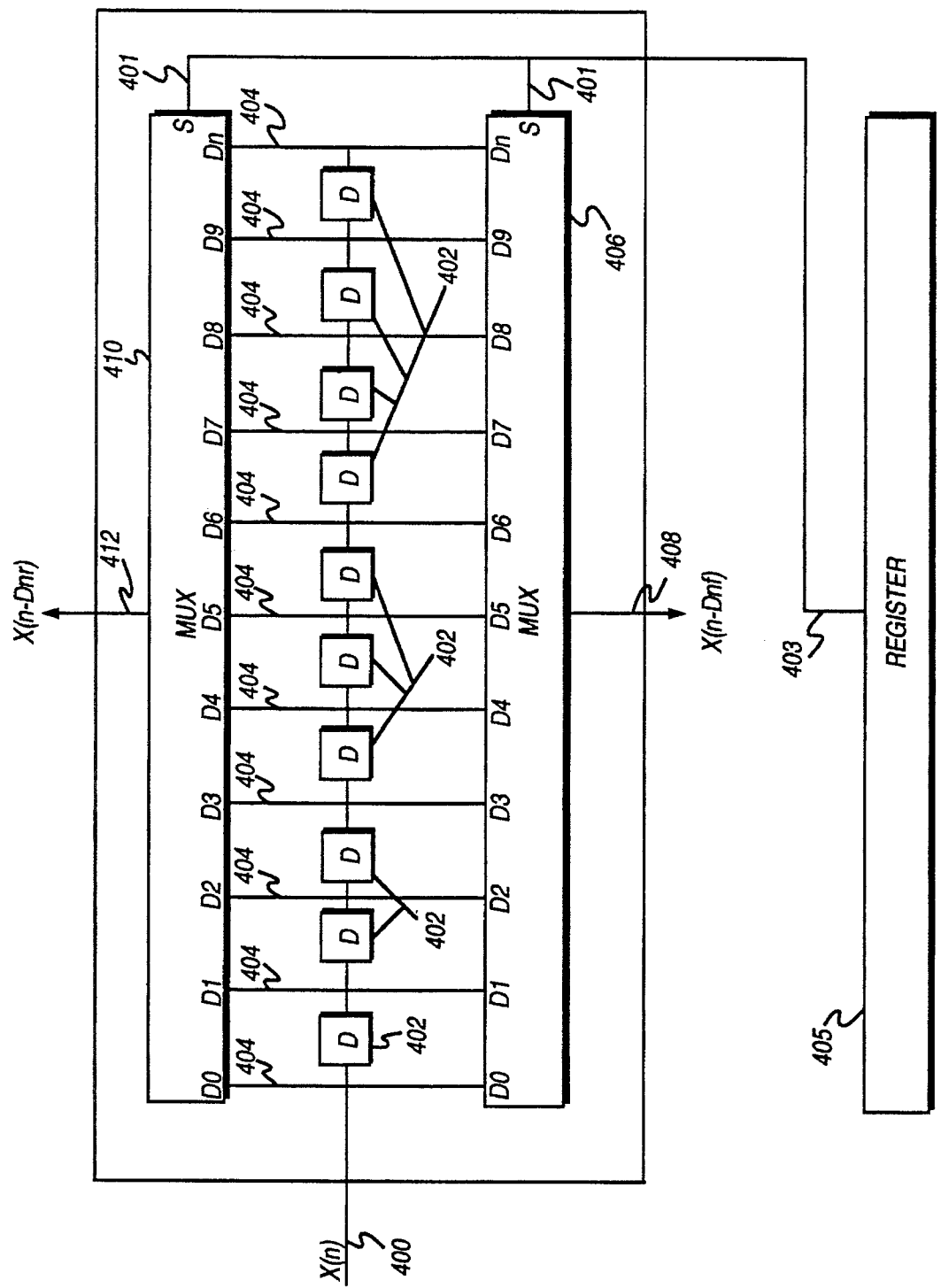
FIG. 12 is a detail diagram of the delay circuit used in the detail diagram of the IIR filter in FIG. 11.

FIG. 12 shows the preferred embodiment for the delay circuit 390 used in the IIR filter in FIG. 11. The input X(n) 400 is passed through a series of consecutive digital delay circuits 402 the outputs D0, D1, D2, D3, . . . Dn 404 of which are connected to the inputs of a multiplexor. Multiplexor 406 is used to select the delayed input signal X(n–Dnf) 408 for canceling the pre-cursor pulses, and multiplexor 410 is used to select the delayed input signal X(n–Dnr) 412 for canceling the post-cursor pulses. The select inputs 401 of the multiplexors 406 and 410 are connected to the outputs 403 of a register 405 programmed with the desired delays.

An alternative embodiment for the IIR implementation would be to connect the feedback line 376 (FIG. 11) to the filter output Y(n) 382 rather than using X(n–Dnr–2). This would eliminate the need for multiplexor 410 further reducing the size and cost of the circuit. However if the feedback is taken from the filter output Y(n) 382, then the delays for canceling the secondary pulses, $D^{nf}$ 392 and $D^{nr}$ 394, are the same and the filter loses some of the flexibility in optimizing the impulse response. Nevertheless, if adjusting the delays independently is not necessary for a given system, then the second multiplexor 410 is not necessary. Further, the delay circuit as shown in FIG. 8 could be used instead of the delay circuit in FIG. 12 if the feedback is taken from the filter output Y(n) 382.

Another significant feature of the present invention is the ability to operate the filter at a half of the sampling rate frequency by duplicating the hardware used in either the FIR or IIR implementation. By parallel processing the input data stream, the bandwidth of the system can be increased if the filter is the limiting component. An example of parallel processing two data samples concurrently is shown in FIG. 13 for the FIR filter of FIG. 10, and in FIG. 16 for the IIR filter of FIG. 11.

Figure 13:
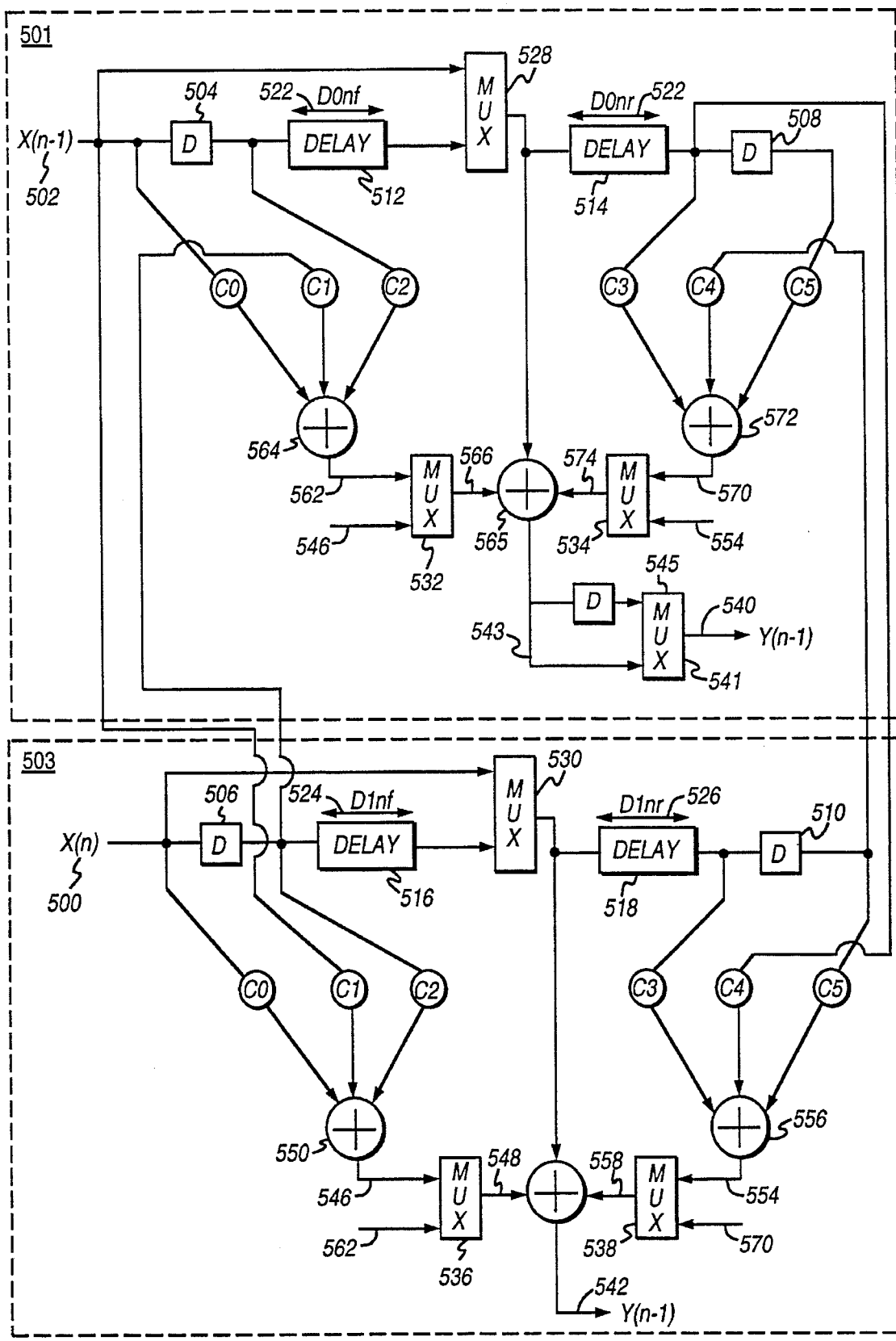
FIG. 13 is a detail diagram of the FIR filter in the present invention for processing two interleaved samples from the input signal concurrently.

In FIG. 13, the FIR filter in FIG. 10 has been duplicated into filters 501 and 503 for processing two data samples concurrently. Every element is duplicated except for the compensation tap delays 504, 506, 508, and 510 which are split between the two duplicate filters. The compensation taps C0 to C5 are interleaved between the two filters as shown. There are also four additional multiplexors 532, 534, 536, and 538 that are used to select the output depending on whether the cursor delays are odd or even hereinafter described. There is also an additional delay 545 and a multiplexor 541 used to select the output Y(n–1) 540 depending on whether the pre-cursor delay is odd or even.

To process two samples concurrently, the data stream is divided into two interleaved data streams: odd data stream X(n–1) 500 processed by filter 501, and even data stream X(n) 502 processed by filter 503. Both filters operate as described for the FIR filter in FIG. 10 except that the outputs Y(n–1) 540 and Y(n) 542 are the interleaved output of the filter in FIG. 10. The delay registers 512,514,516, and 518 and multiplexors 532, 534, 536, 538 and 541 are programmed as follows:

1. If the delay between the main sample pulse and the pre-cursor pulse is even, then delay registers 512 and 516 are programmed to:

$D0nf=D1nf=Dnf/2$ where D0nf 520 and D1nf 524 are the values loaded into delay registers 512 and 516 respectively, and Dnf 590 (FIG. 14) is the pre-cursor delay between the main sample pulse and the pre-cursor pulse of the input signal. The output 566 of multiplexor 532 is connected to the output 562 of adder 564, and the output 548 of multiplexor 536 is connected to the output 546 of adder 550. The output Y(n–1) 540 of multiplexor 541 is connected to the output 543 of adder 565.

2. If the delay between the main sample pulse and the pre-cursor pulse is odd, then delay registers 512 and 516 are programmed to:

$D0nf=(Dnf-1)/2,$ $D1nf=(Dnf+1)/2.$

The output 566 of multiplexor 532 is connected to the output 546 of adder 550, and the output 548 of multiplexor 536 is connected to the output 562 of adder 564. The output Y(n−1) 540 of multiplexor 541 is connected to the output 543 of adder 565 through delay 545.

3. If the delay between the main sample pulse and the post-cursor pulse is even, then delay registers 514 and 518 are programmed to:

$D0nr=D1nr=Dnr/2$ where D0nr 522 and D1nr 526 are the values loaded into delay registers 514 and 518 respectively, and Dnr 592 (FIG. 14) is the post-cursor delay between the main sample pulse and the post-cursor pulse of the input signal. The output 574 of multiplexor 534 is connected to the output 570 of adder 572, and the output 558 of multiplexor 538 is connected to the output 554 of adder 556.

4. If the delay between the main sample pulse and the pre-cursor pulse is odd, then delay registers 514 and 518 are programmed to:

$D0nr=(Dnr+1)/2$ $D1nr=(Dnr-1)/2$

The output 574 of multiplexor 534 is connected to the output 554 of adder 556, and the output 558 of multiplexor 538 is connected to the output 570 of adder 572.

The operation of the filter can be understood by tracing an impulse through the circuit. That is, the impulse response outputs Y(n−1) 540 and Y(n) 542 are generated by tracing an input 01000 . . . through the filter. After splitting the input into even and odd interleaved data streams, X(n−1) 502 is 0000 . . . and X(n) 500 is 1000 . . . .

Figure 14:
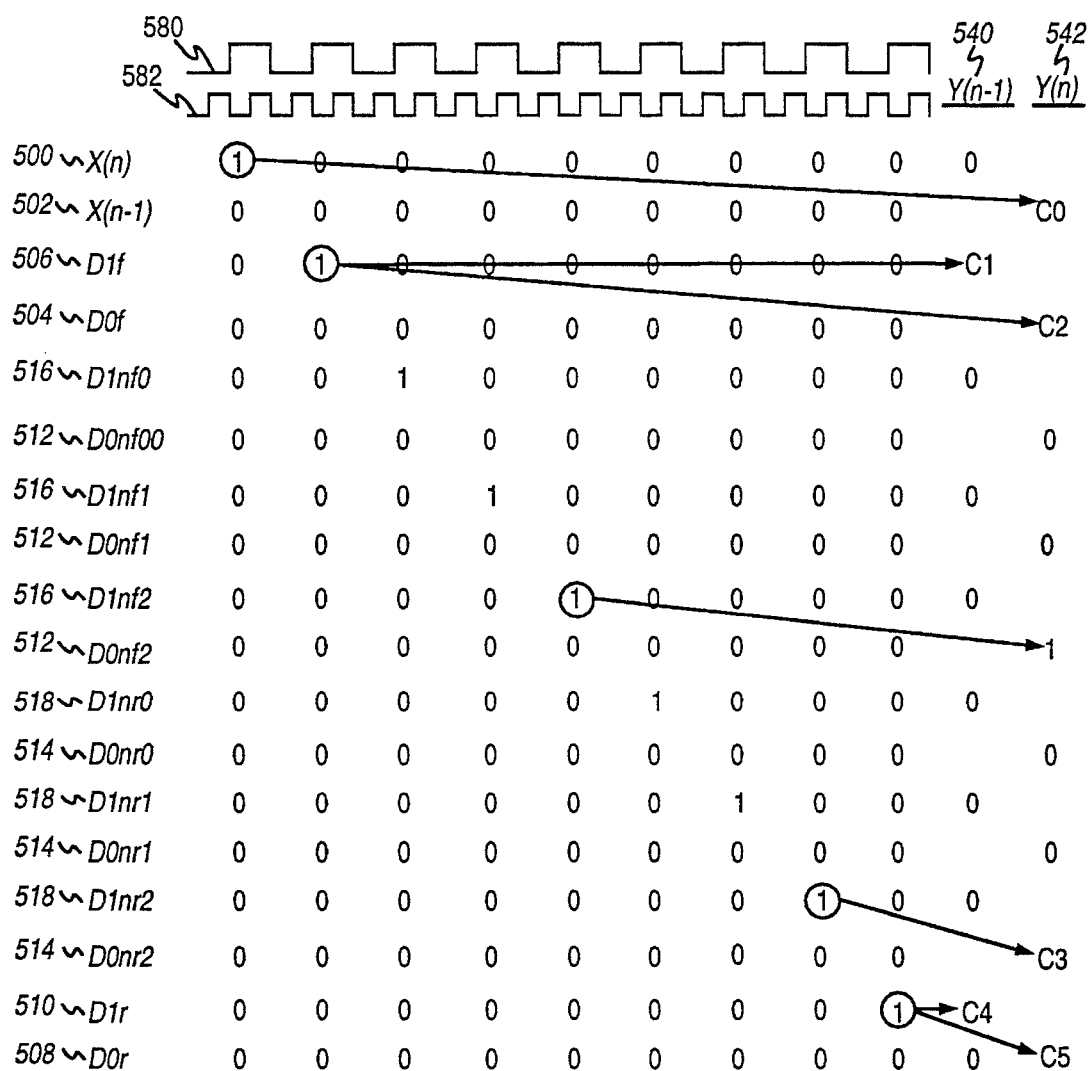
FIG. 14 illustrates how the impulse response is generated for the FIR filter in FIG. 13 when the delay between the secondary pulses and main pulse is even.
Figure 14:
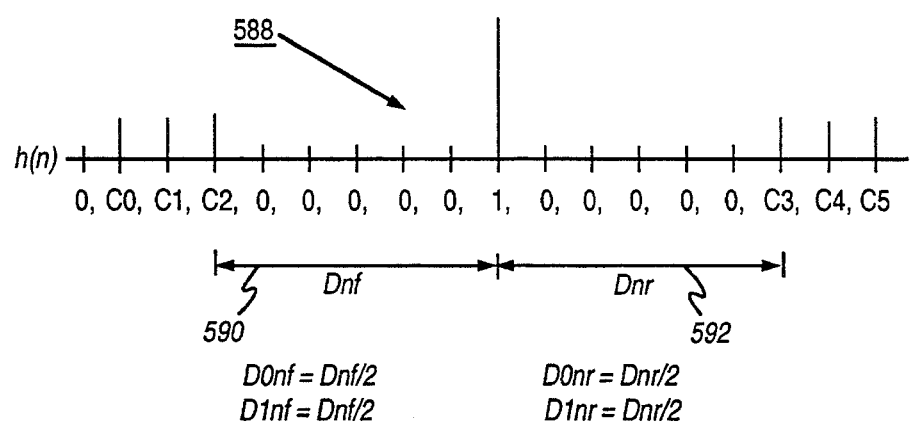

FIG. 14 shows a trace of the delay register outputs and the filter outputs Y(n) 542 and Y(n−1) 540 where both the precursor delay Dnf 590 and the post-cursor delay Dnr 592 are even. The sample clock 582 operates at twice the frequency of the filter clock 580. An impulse 01000 . . . is interleaved into 0000 . . . and 1000 . . . and applied to the filter inputs X(n) 500 and X(n−1) 502 respectively, and traced through the delay circuits. Because the input data is interleaved, only X(n) 500 will have a 1. The programmable delay lines 512, 514, 516, and 518 are set according to the above equations:

$D0nf=D1nf=Dnf/2=6/2=3,$ $D0nr=D1nr=Dnr/2=6/2=3.$

The resulting impulse response outputs Y(n) 542 and Y(n−1) 540 represent the interleaved impulse response 588. The encircled is illustrate when the non-zero outputs of the filters are generated.

Figure 15:
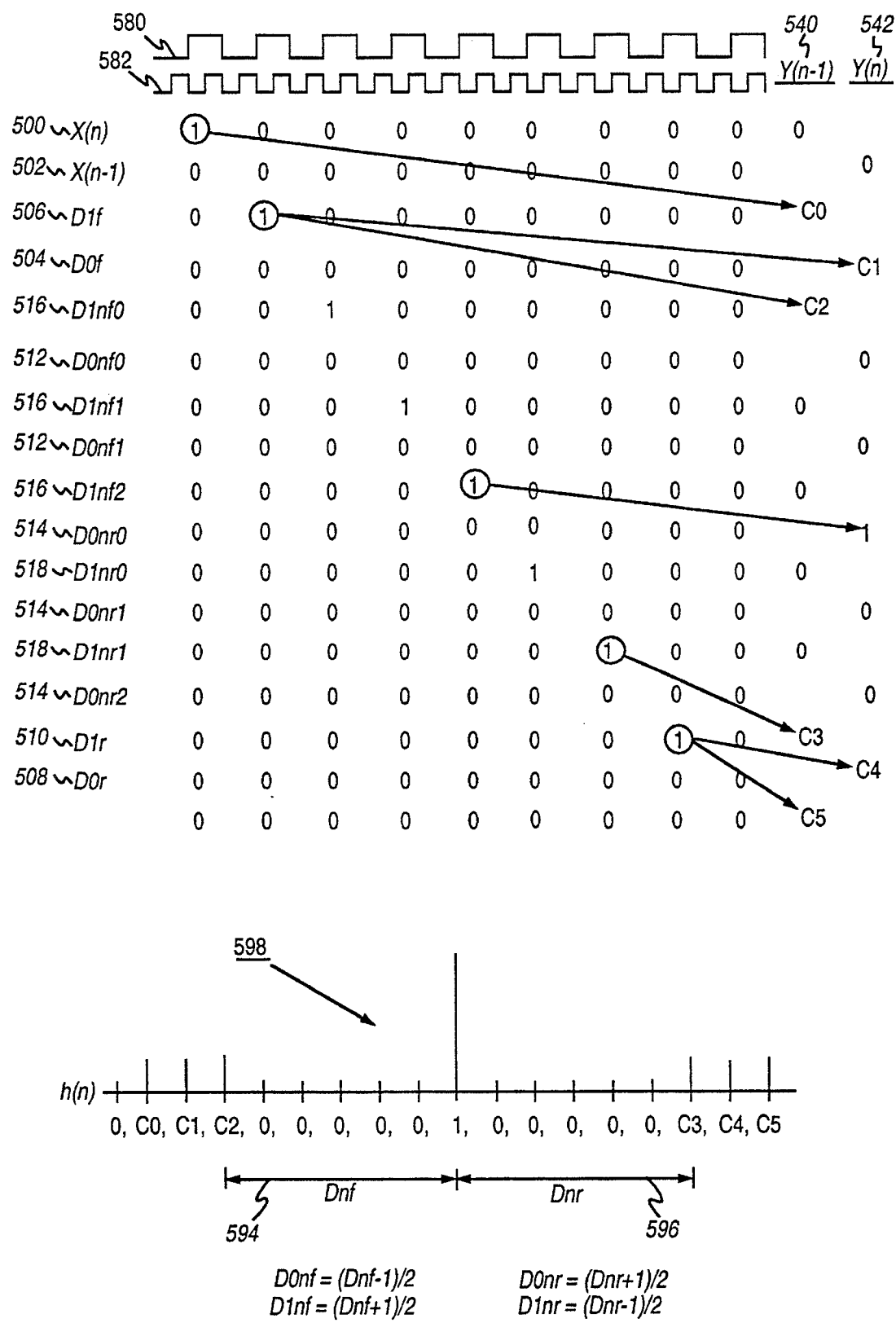
FIG. 15 illustrates how the impulse response is generated for the FIR filter in FIG. 13 when the delay between the secondary pulses and main pulse is odd.

FIG. 15 shows a trace of the delay register outputs and the filter outputs Y(n) 542 and Y(n−1) 540 where both the precursor delay Dnf 594 and the post-cursor delay Dnr 596 are odd. The programmable delay lines 512, 514, 516 and 518 are set according to the above equations:

$D0nf=(Dnf-1)/2=4/2=2,$ $D1nf=(Dnf+1)/2=6/2=3,$ $D0nr=(Dnr+1)/2=6/2=3,$ $D1nr=(Dnr-1)/2=4/2=2.$

The resulting impulse response outputs Y(n) 542 and Y(n−1) 540 represent the interleaved impulse response 598. The output Y(n−1) 540 is delayed through delay 545 as described above.

The impulse response for a mixed even and odd pre-cursor and post-cursor delays are generated in the same manner. Also, the desired impulse response is achieved if the input signal is sampled such that X(n−1) 502 is 1000 . . . and X(n) 500 is 0000 . . . .

Multiplexors 528 and 530 are used to disable the pre-cursor correcting portion of the filters when the delay associated with canceling the pre-cursor pulses cannot be tolerated. When the pre-cursor correcting portion of the filter is disabled, the outputs Y(n) 542 and Y(n−1) 540 are not delayed from the inputs X(n) 500 and X(n−1) 502 respectively while still canceling the post-cursor pulses.

Figure 16:
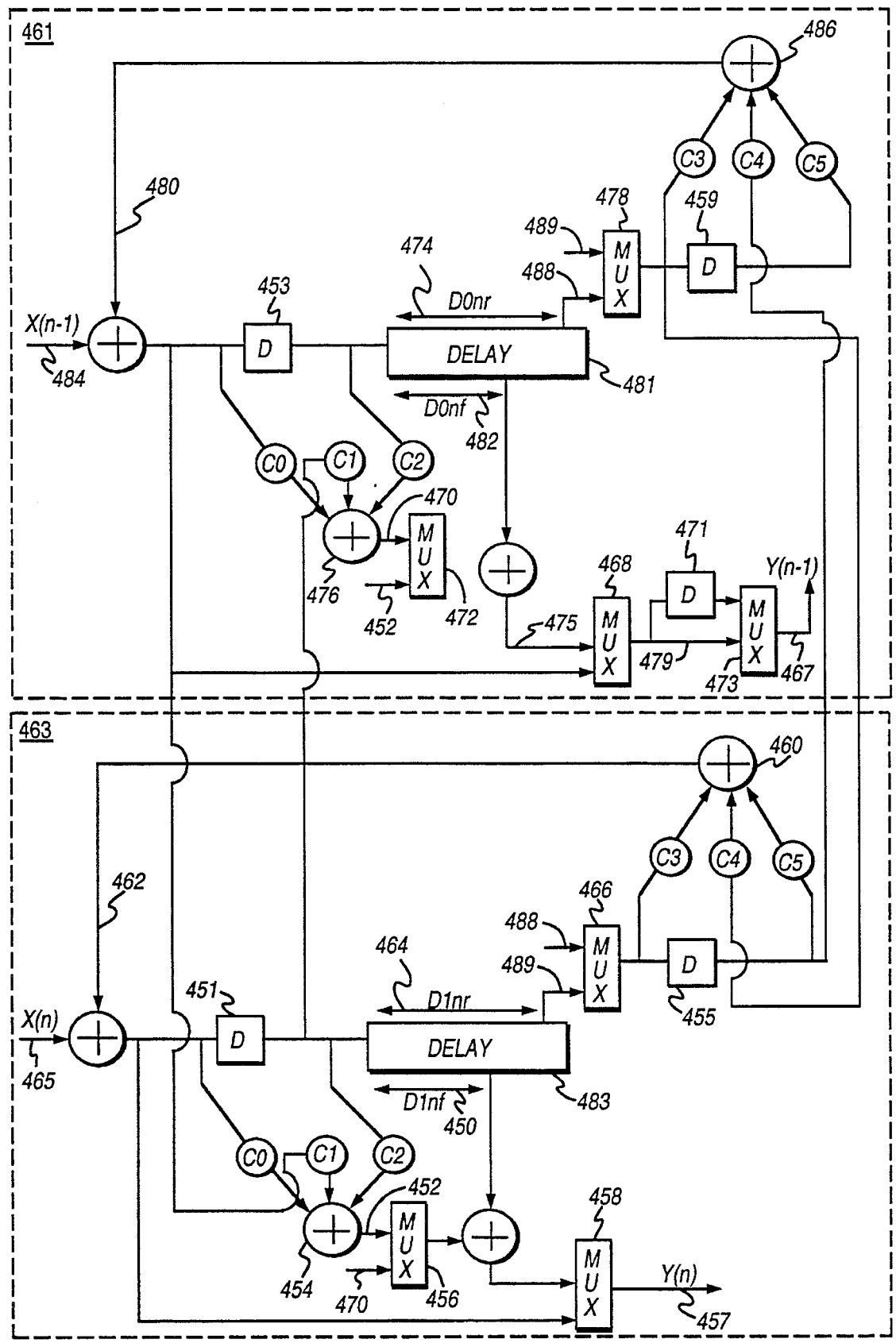
FIG. 16 is a detail diagram of the IIR filter in the present invention for processing two interleaved samples from the input signal concurrently.

In FIG. 16, the IIR filter in FIG. 11 has been duplicated into filters 461 and 463 for processing two data samples concurrently. Again, every element is duplicated except for the compensation tap delays 453, 459, 451, and 455 which are split between the two duplicate filters. The compensation taps C0 to C5 are interleaved between the two filters as shown. As with the FIR implementation described above, there are four additional multiplexors 478, 472, 466, and 456 that are used to select the output depending on whether the cursor delays are odd or even hereinafter described. There is also the additional delay 471 and multiplexor 473 used to select the output Y(n−1) 467 depending on whether the pre-cursor delay is odd or even.

To process two samples concurrently, the data stream is divided into two interleaved data streams: odd data stream X(n−1) processed by filter 461, and even data stream X(n) 465 process by filter 463. Both filters operate as described for the IIR filter in FIG. 11 except that the outputs Y(n−1) 467 and Y(n) 457 are the interleaved output of the filter in FIG. 11. The delay registers 481 and 483 and multiplexors 478, 472, 466, 456 and 473 are programmed as follows:

1. If the delay between the main sample pulse and the pre-cursor pulse is even, then pre-cursor delay of registers 481 and 483 are programmed to:

$D0nf=D1nf=Dnf/2$ where D0nf 482 and D1nf 450 are the values selected for the pre-cursor delay of registers 481 and 483 respectively, and Dnf 492 (FIG. 17) is the pre-cursor delay between the main sample pulse and the pre-cursor pulse of the input signal. The output of multiplexor 472 is connected to the output 470 of adder 476, and the output of multiplexor 456 is connected to the output 452 of adder 454. The output Y(n−1) 467 of multiplexor 473 is connected to the output 479 of multiplexor 468.

2. If the delay between the main sample pulse and the pre-cursor pulse is odd, then the pre-cursor delay of registers 481 and 483 are programmed to:

$D0nf=(Dnf-1)/2,$ $D1nf=(Dnf+1)/2.$

The output of multiplexor 472 is connected to the output 452 of adder 454, and the output of multiplexor 456 is connected to the output 470 of adder 476. The output Y(n−1) 467 of multiplexor 473 is connected to the output 479 of multiplexor 468 through delay 471.

3. If the delay between the main sample pulse and the post-cursor pulse is even, then the post-cursor delay of registers 481 and 483 are programmed to:

$$D0nr=D1nr=Dnr/2$$

where D0nr 474 and D1nr 464 are the values selected for the post-cursor delay of registers 514 and 518 respectively, and Dnr 494 (FIG. 17) is two less than the post-cursor delay between the main sample pulse and the post-cursor pulse of the input signal. The output of multiplexor 478 is connected to the post-cursor delay output 488 of delay register 481, and the output of multiplexor 466 is connected to the post-cursor delay output 489 of delay register 483.

4. If the delay between the main sample pulse and the pre-cursor pulse is odd, then post-cursor delay of registers 481 and 483 are programmed to:

$$D0nr=(Dnr-1)/2,$$

$$D1nr=(Dnr+1)/2.$$

The output of multiplexor 478 is connected to the post-cursor delay output 489 of delay register 483, and the output of multiplexor 466 is connected to the post-cursor delay output 488 of delay register 481.

Again, the operation of the filter can be understood by tracing an impulse through the circuit. That is, the impulse response outputs Y(n−1) 467 and Y(n) 457 are generated by tracing an input 01000 . . . through the filter. After splitting the input into even and odd interleaved data streams, X(n−1) 484 is 0000 . . . and X(n) 465 is 1000 . . . .

Figure 17:
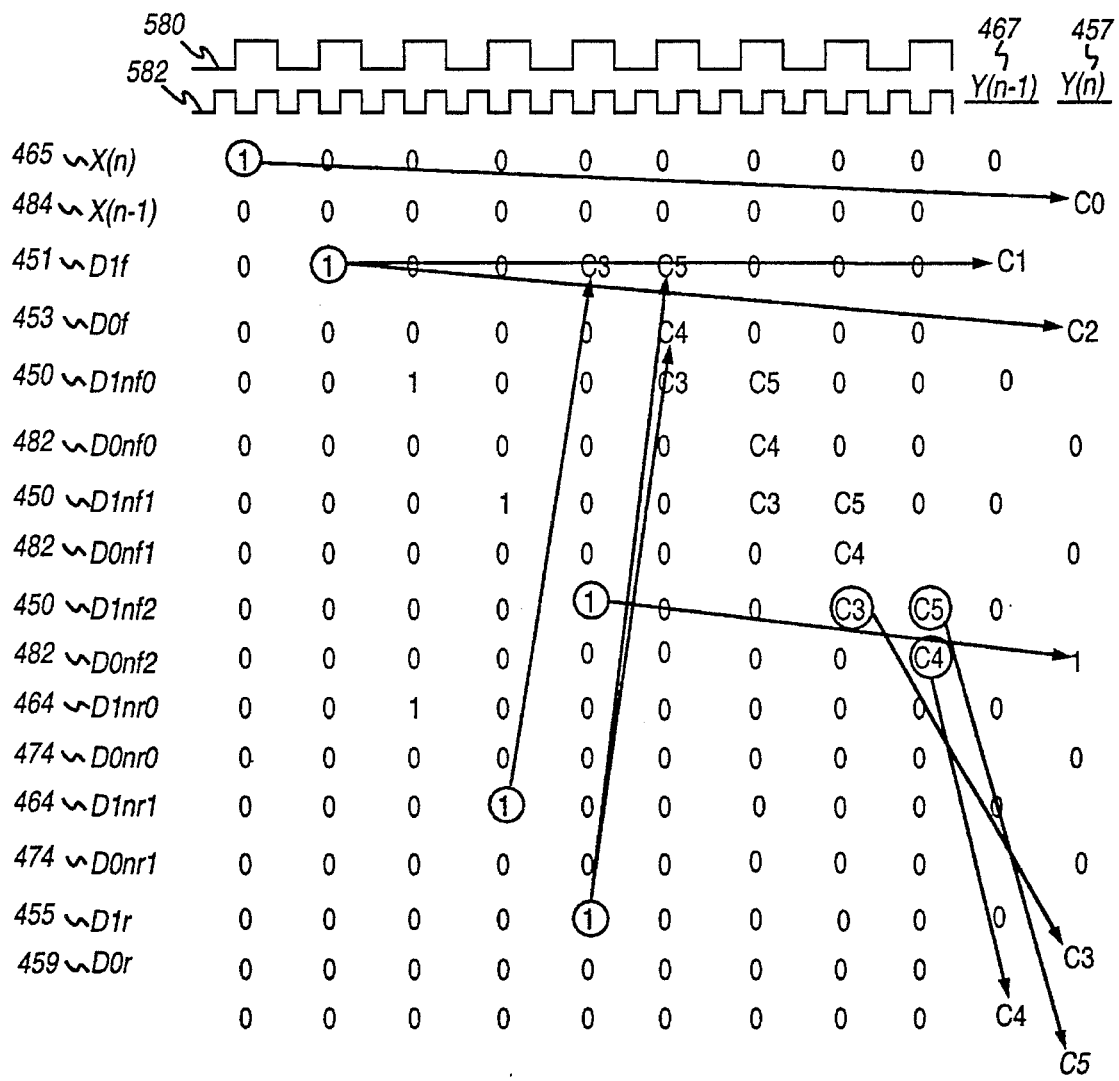
FIG. 17 illustrates how the impulse response is generated for the IIR filter in FIG. 16 when the delay between the secondary pulses and main pulse is even.
Figure 17:
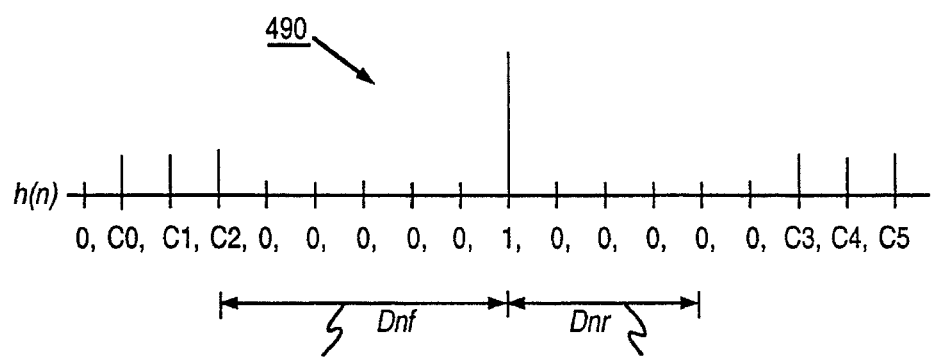

FIG. 17 shows a trace of the delay register outputs and the filter outputs Y(n) 457 and Y(n−1) 467 where both the pre-cursor delay Dnf 492 and the post-cursor delay (Dnr+2) 494 are even. The sample clock 582 operates at twice the frequency of the filter clock 580. An impulse 01000 . . . is interleaved into 0000 . . . and 1000 . . . and applied to the filter inputs X(n) 465 and X(n−1) 484 respectively, and traced through the delay circuits. Because the input data is interleaved, only X(n) 465 will have a 1. The programmable delay lines 481 and 483 are set according to the above equations:

$$D0nf=D1nf=Dnf/2=6/2=3,$$

$$D0nr=D1nr=Dnr/2=4/2=2.$$

The resulting impulse response outputs Y(n) 457 and Y(n−1) 467 represent the interleaved impulse response 490. The encircled is illustrate when the non-zero outputs of the filters are generated.

Figure 18:
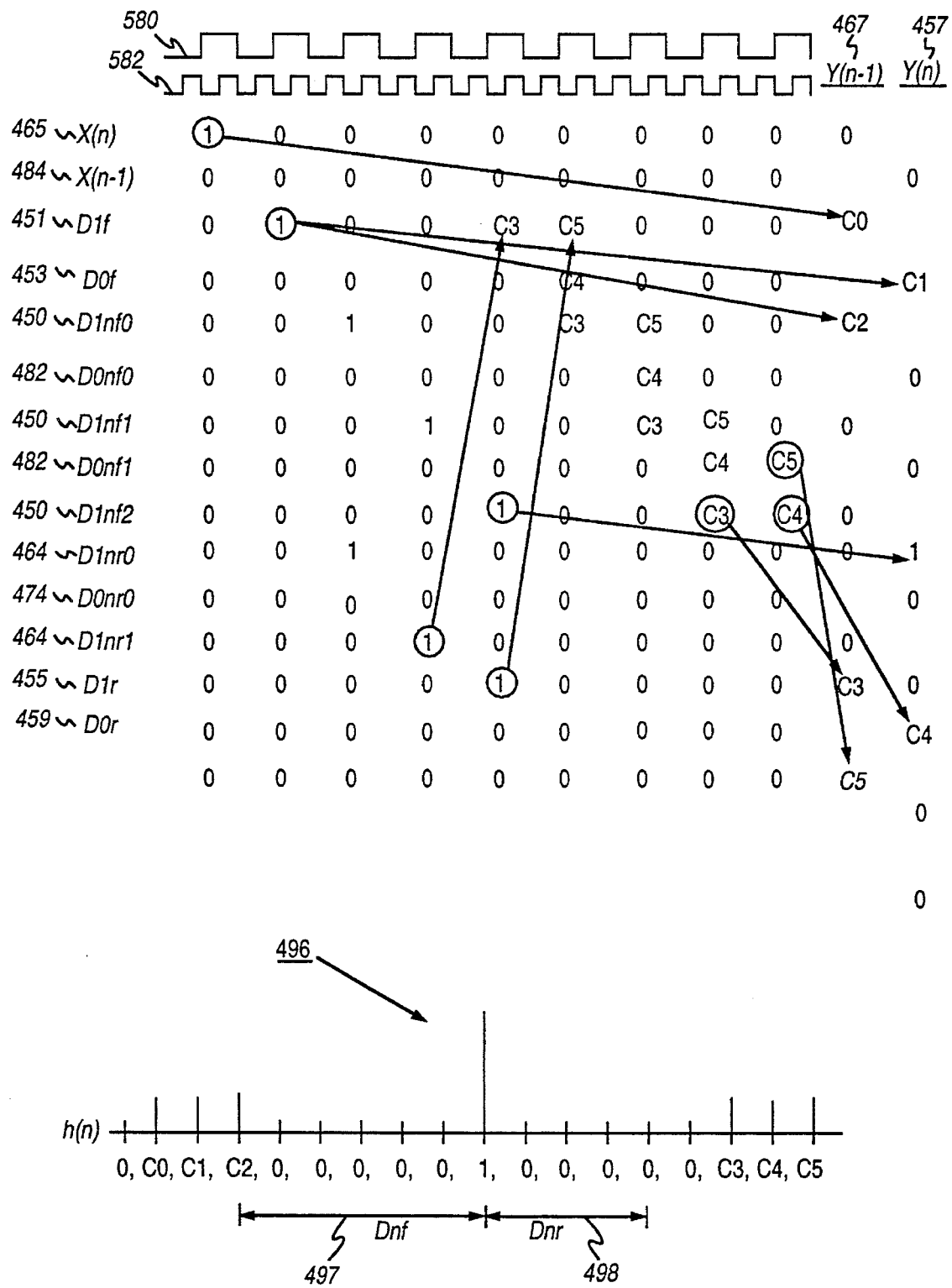
FIG. 18 illustrates how the impulse response is generated for the IIR filter in FIG. 16 when the delay between the secondary pulses and main pulse is odd.

FIG. 18 shows a trace of the delay register outputs and the filter outputs Y(n) 457 and Y(n−1) 467 where both the precursor delay Dnf 497 and the post-cursor delay (Dnr+2) 498 are odd. The programmable delay lines 481 and 483 are set according to the above equations:

$$D0nf=(Dnf-1)/2=4/2=2,$$

$$D1nf=(Dnf+1)/2=6/2=3,$$

$$D0nr=(Dnr-1)/2=2/2=1,$$

$$D1nr=(Dnr+1)/2=4/2=2.$$

The resulting impulse response outputs Y(n) 457 and Y(n−1) 467 represent the interleaved impulse response 496. The output Y(n−1) 467 is delayed through delay 471 as described above.

The impulse response for a mixed even and odd pre-cursor and post-cursor delays are generated in the same manner. Also, the desired impulse response is achieved if the input signal is sampled such that X(n−1) 484 is 1000 . . . and X(n) 465 is 0000 . . . .

Multiplexors 468 and 458 are used to disable the pre-cursor correcting portion of the filters when the delay associated with canceling the pre-cursor pulses cannot be tolerated. When the pre-cursor correcting portion of the filter is disabled, the outputs Y(n) 457 and Y(n−1) 467 are not delayed from the inputs X(n) 465 and X(n−1) 484 respectively while still canceling the post-cursor pulses.

While the present invention has been described in connection with a preferred embodiment, it should be understood that it is not intended to limit the invention to that particular embodiment. For example, FIG. 7 shows a five tap delay line in which a first fixed delay element 45 is followed by a first programmable delay 47, a second programmable delay 53 and a second fixed delay 55. If desired, additional fixed delay elements could be provided with elements 45 and 55, with taps to gain additional modifying signals. Essentially, the invention provides a first fixed delay line with a group of taps followed by a first programmable delay line then a main tap followed by a second programmable delay line and finally a second fixed delay line with a second group of taps. This is in recognition of the fact that there is a substantial separation between the main pulse and the secondary pulses, and that there is no substantial requirement for smoothing the waveform in the area of separation. The invention is intended to cover that alternative and all alternatives, modifications and equivalents as may be included within the spirit and scope of the invention as defined by the appended claims.

We claim:

1. A method for filtering pre-cursive and post-cursive secondary pulses generated when reading digital data from a magnetic storage device utilizing a magnetic read head, comprising the steps of:

(a) sensing magnetic transitions on a magnetic storage medium using the magnetic read head and generating an analog input signal, said analog input signal comprising main pulses having pre-cursor and post-cursor secondary pulses; and (b) converting the analog input signal into a discrete time input signal; and (c) filtering the discrete time input signal utilizing a discrete time filter having a particular impulse response, the impulse response having a predetermined number of compensation coefficients delayed from a center coefficient by a period approximately equal to the period between the main and secondary pulse samples in the discrete time input signal such that at least one of the secondary pulses is attenuated when the discrete time input signal is convolved with the impulse response of the filter, wherein the discrete time filter comprises a number of unit delay elements greater than nine.

2. The method as recited claim 1, wherein the discrete time filter comprises a plurality of consecutive delay elements wherein at least two of the delay elements do not have a compensation tap there between.

3. The method as recited in claim 1, wherein the step of filtering comprises the steps of:

(a) first filtering the discrete time input signal to attenuate only the post-cursor secondary pulses; and (b) second filtering the discrete time input signal to attenuate both the pre-cursor and post-cursor secondary pulses; and (c) transmitting the first filtered discrete time input signal to a first discrete time output signal, and transmitting the second filtered discrete time input signal to a second discrete time output signal.

4. The method as recited in claim 1, further comprising the step of adaptively adjusting the magnitude of the compensation coefficients thereby optimizing the impulse response of the filter to operate in a particular environment.

5. The method as recited in claim 1, further comprising the step of disabling the compensation coefficients being used to attenuate the pre-cursor secondary pulses thereby avoiding any delay between the discrete time input signal and a discrete time output signal of the filter while still attenuating the post-cursor secondary pulses.

6. The method as recited in claim 1, wherein the step of filtering comprises the steps of:

(a) first convolving a center compensation tap with the sample values of the pre-cursor secondary pulse in the discrete time input signal to generate a first convolution;

(b) second convolving a plurality of pre-cursor compensation taps with the sample values of the main pulse in the discrete time input signal to generate a second convolution, the plurality of pre-cursor compensation taps being separated from the center tap by a period approximately equal to the period between the main pulse and the precursor secondary pulse samples in the discrete time input signal; and (c) adding the first and second convolutions.

7. The method as recited in claim 1, wherein the step of filtering comprises the steps of:

(a) first convolving a center tap with the sample values of the post-cursor secondary pulse in the discrete time input signal to generate a first convolution;

(b) second convolving a plurality of post-cursor compensation taps with the sample values of the main pulse in the discrete time input signal to generate a second convolution, the plurality of post-cursor compensation taps being separated from the center tap by a period approximately equal to the period between the main pulse and the post-cursor secondary pulse samples in the discrete time input signal; and (c) adding the first and second convolutions.

8. The method as recited in claim 7, further comprising the step of adaptively delaying by a post-cursor delay, between the center tap and the plurality of the post-cursor compensation taps, a period approximately equal to the period between the main pulse and the post-cursor secondary pulse samples in the discrete time input signal thereby optimizing the impulse response of the filter to operate in a particular environment.

9. The method as recited in claim 6, further comprising the step of adaptively delaying by a pre-cursor delay, between the plurality of pre-cursor compensation taps and the center tap, a period approximately equal to the period between the main pulse and pre-cursor secondary pulse samples in the discrete time input signal thereby optimizing the impulse response of the filter to operate in a particular environment.

10. The method as recited in claim 1, wherein the step of filtering comprises the steps of:

(a) delaying the discrete time input signal by a period approximately equal to the period between the main pulse and the post-cursor secondary pulse samples in the discrete time input signal;

(b) convolving a plurality of post-cursor compensation taps with the sample values of the main pulse in the discrete time input signal to generate a convolution; and (c) attenuating the post-cursor pulses by adding the discrete time input signal to the convolution.

11. The method as recited in claim 1, wherein the step of filtering comprises the steps of:

(a) first adding a post-cursor convolution to the discrete time input signal to generate a feed forward signal;

(b) first convolving a plurality of pre-cursor compensation taps with the feed forward signal to generate a first convolution;

(c) first delaying the feed forward signal between the plurality of pre-cursor compensation taps and a center tap of the filter;

(d) second convolving the feed forward signal with the center tap to generate a second convolution;

(e) second delaying the feed forward signal between the plurality of pre-cursor compensation taps and a plurality of post-cursor compensation taps; and (f) third convolving the feed forward signal with the post-cursor compensation taps to generate the post-cursor convolution.

12. The method as recited in claim 11, further comprising the step of second adding the first and second convolutions to generate a discrete time output signal of the filter.

13. The method as recited in claim 11, further comprising the steps of:

(a) second adding the first and second convolutions to generate a first discrete time output signal of the filter; and (b) connecting the feed forward signal to a second discrete time output.

14. The method as recited in claim 11, wherein at least part of the first and second delays are generated using the same circuitry.

15. The method as recited in claim 11, wherein the first and second delays being programmable.

16. The method as recited in claim 11, further comprising the steps of:

(a) adaptively adjusting the first delaying by an amount approximately equal to the period between the precursor secondary pulse and main pulse samples in the discrete time input signal; and (b) adaptively adjusting the second delaying by an amount approximately equal to the period between the main pulse and post-cursor secondary pulse samples in the discrete time input signal;

thereby optimizing the impulse response of the filter to operate in a particular environment.

17. The method as recited in claim 11, further comprising the step of multiplexing the feed forward signal and a summation of the first and second convolutions to a discrete time output signal of the filter, wherein the plurality of pre-cursor compensation taps being disabled by selecting the feed forward signal as the discrete time output signal.

18. The method as recited in claim 1, further comprising the step of interleaving the discrete time signal into a first and second discrete time input signal comprising the even and odd samples of the discrete time signal respectively, wherein:

(a) filtering the discrete time input signal of step (c) comprises filtering the first discrete time input signal with a first discrete time filter and filtering the second discrete time input signal with a second discrete time filter;

(b) the first and second discrete time filters having a particular interleaved impulse response; and (c) the interleaved impulse response having a predetermined number of compensation coefficients delayed from a center coefficient by a period approximately equal to the period between the main and secondary pulse samples in the discrete time input signals such that at least one of the secondary pulses is attenuated when the first and second discrete time input signals are convolved with the interleaved impulse response of the filter.

19. An apparatus for storing and retrieving digital data from a magnetic medium, comprising:

(a) a magnetic read head for sensing magnetic transitions on the magnetic medium to generate an analog read signal comprising main pulses and precursor and post-cursor secondary pulses;

(b) a sampling device for sampling the analog read signal to generate a discrete time input signal; and (c) a discrete time filter for filtering the discrete time input signal to attenuate the pre-cursive and post-cursive secondary pulses, said discrete time filter comprising a plurality of compensation taps to generate an impulse response having a predetermined number of compensation coefficients delayed from a center coefficient by a period approximately equal to the period between the main and secondary pulse samples in the discrete time input signal such that at least one of the secondary pulses is attenuated when the discrete time input signal is convolved with the impulse response of the filter, wherein the discrete time filter comprises a number of unit delay elements greater than nine.

20. The apparatus for storing and retrieving digital data from a magnetic medium as recited in claim 19, wherein the discrete time filter further comprises a plurality of consecutive delay elements wherein at least two of the delay elements do not have a compensation tap there between.

21. The apparatus for storing and retrieving digital data from a magnetic medium as recited in claim 19, wherein the discrete time filter further comprises:

(a) a first discrete time output for transmitting the filtered discrete time input signal having only the post-cursor pulses attenuated; and (b) a second discrete time output for transmitting the filtered discrete time input signal having both the pre-cursor and post-cursor pulses attenuated.

22. The apparatus for storing and retrieving digital data from a magnetic medium as recited in claim 19, wherein the discrete time filter further comprising a means for adaptively adjusting the magnitude of the compensation coefficients thereby optimizing the impulse response of the filter to operate in a particular environment.

23. The apparatus for storing and retrieving digital data from a magnetic medium as recited in claim 19, wherein the discrete time filter further comprising a means for disabling the compensation coefficients being used to attenuate the pre-cursor secondary pulses thereby avoiding any delay between the discrete time input signal and a discrete time output signal of the filter while still attenuating the post-cursor secondary pulses.

24. The apparatus for storing and retrieving digital data from a magnetic medium as recited in claim 19, wherein the discrete time filter further comprising:

(a) a center compensation tap first convolved with the sample values of the pre-cursor secondary pulse in the discrete time input signal to generate a first convolution;

(b) a plurality of pre-cursor compensation taps separated from the center tap by a period approximately equal to the period between the main pulse and the pre-cursor secondary pulse samples in the discrete time input signal, the pre-cursor compensation taps being second convolved with the sample values of the main pulse in the discrete time input signal to generate a second convolution; and (c) an adder for adding the first and second convolutions.

25. The apparatus for storing and retrieving digital data from a magnetic medium as recited in claim 19, wherein the discrete time filter further comprising:

(a) a center tap first convolved with the sample values of the post-cursor secondary pulse in the discrete time input signal to generate a first convolution;

(b) a plurality of post-cursor compensation taps separated from the center tap by a period approximately equal to the period between the main pulse and the post-cursor secondary pulse samples in the discrete time input signal, the post-cursor compensation taps being second convolved with the sample values of the main pulse in the discrete time input signal to generate a second convolution; and (c) an adder for adding the first and second convolutions.

26. The apparatus for storing and retrieving digital data from a magnetic medium as recited in claim 25, wherein the discrete time filter further comprising a means for adaptively delaying by a post-cursor delay, between the center tap and the plurality of the post-cursor compensation taps, a period approximately equal to the period between the main pulse and the post-cursor secondary pulse samples in the discrete time input signal thereby optimizing the impulse response of the filter to operate in a particular environment.

27. The apparatus for storing and retrieving digital data from a magnetic medium as recited in claim 24, wherein the discrete time filter further comprising a means for adaptively delaying by a pre-cursor delay, between the plurality of pre-cursor compensation taps and the center tap, a period approximately equal to the period between the main pulse and pre-cursor secondary pulse samples in the discrete time input signal thereby optimizing the impulse response of the filter to operate in a particular environment.

28. The apparatus for storing and retrieving digital data from a magnetic medium as recited in claim 19, wherein the discrete time filter further comprising:

(a) a delay element for delaying the discrete time input signal by a period approximately equal to the period between the main pulse and the post-cursor secondary pulse samples in the discrete time input signal;

(b) a plurality of post-cursor compensation taps convolved with the sample values of the main pulse in the discrete time input signal to generate a convolution; and (c) an adder for adding the discrete time input signal to the convolution thereby attenuating the post-cursor secondary pulses.

29. The apparatus for storing and retrieving digital data from a magnetic medium as recited in claim 19, wherein the discrete time filter further comprising:

(a) a first adder for adding a post-cursor convolution to the discrete time input signal to generate a feed forward signal;

(b) a first delay element for delaying the feed forward signal between a plurality of pre-cursor compensation taps and a center tap of the filter, the feed forward signal being first convolved with the pre-cursor compensation taps to generate a first convolution and being second convolved with the center tap to generate a second convolution; and (c) a second delay element for delaying the feed forward signal between the plurality of pre-cursor compensation taps and a plurality of post-cursor compensation taps, the feed forward signal being third convolved with the post-cursor compensation taps to generate the post-cursor convolution.

30. The apparatus for storing and retrieving digital data from a magnetic medium as recited in claim 29, wherein the discrete time filter further comprising a second adder for adding the first and second convolutions to generate a discrete time output signal of the filter.

31. The apparatus for storing and retrieving digital data from a magnetic medium as recited in claim 29, wherein the discrete time filter further comprising:

(a) a second adder for adding the first and second convolutions to generate a first discrete time output signal of the filter; and (b) a second discrete time output connected to the feed forward signal.

32. The apparatus for storing and retrieving digital data from a magnetic medium as recited in claim 29, wherein at least part of the first and second delay elements share the same circuitry.

33. The apparatus for storing and retrieving digital data from a magnetic medium as recited in claim 29, wherein the first and second delay elements being programmable.

34. The apparatus for storing and retrieving digital data from a magnetic medium as recited in claim 29, wherein:

(a) the first delay element being adaptively adjusted by an amount approximately equal to the period between the pre-cursor secondary pulse and main pulse samples in the discrete time input signal; and (b) the second delay element being adaptively adjusted by an amount approximately equal to the period between the main pulse and post-cursor secondary pulse samples in the discrete time input signal; thereby optimizing the impulse response of the filter to operate in a particular environment.

35. The apparatus for storing and retrieving digital data from a magnetic medium as recited in claim 29, wherein the discrete time filter further comprising a multiplexor for multiplexing the feed forward signal and a summation of the first and second convolutions to a discrete time output signal of the filter, wherein the plurality of pre-cursor compensation taps being disabled by selecting the feed forward signal as the discrete time output signal.

36. The apparatus as recited in claim 19, further comprising a means for interleaving the discrete time input signal into an even and odd discrete time input signal, wherein:

(a) the discrete time filter comprises a first discrete time filter for filtering the even discrete time input signal and a second discrete time signal for filtering the odd discrete time input signal; and (b) said first and second discrete time filters having an interleaved impulse response with a predetermined number of compensation coefficients delayed from a center coefficient by a period approximately equal to the period between the main and secondary pulse samples in the discrete time input signal such that at least one of the secondary pulses is attenuated when the interleaved discrete time input signal is convolved with the interleaved impulse response of the filter.

37. The apparatus for storing and retrieving digital data from a magnetic medium as recited in claim 19, wherein the compensation coefficients are selected from the group consisting of the values $\frac{1}{32}$, $\frac{1}{16}$ and zero.

38. The apparatus for storing and retrieving digital data from a magnetic medium as recited in claim 19, wherein a value for each compensation coefficient is selected from a plurality of values through a multiplexor.

* * * * *